United States Patent
Tanitsu

(10) Patent No.: US 9,116,346 B2
(45) Date of Patent: Aug. 25, 2015

(54) ILLUMINATION APPARATUS, ILLUMINATION METHOD, EXPOSURE APPARATUS, AND DEVICE MANUFACTURING METHOD

(75) Inventor: Osamu Tanitsu, Saitama (JP)

(73) Assignee: NIKON CORPORATION, Tokyo (JP)

( * ) Notice: Subject to any disclaimer, the term of this patent is extended or adjusted under 35 U.S.C. 154(b) by 1040 days.

(21) Appl. No.: 12/256,055

(22) Filed: Oct. 22, 2008

(65) Prior Publication Data

US 2009/0116093 A1 May 7, 2009

Related U.S. Application Data

(60) Provisional application No. 60/996,295, filed on Nov. 9, 2007.

(30) Foreign Application Priority Data

Nov. 6, 2007 (JP) .................................. 2007-287987

(51) Int. Cl.
*G03B 27/54* (2006.01)
*G03B 27/72* (2006.01)
(Continued)

(52) U.S. Cl.
CPC ........ *G02B 26/0833* (2013.01); *G02B 27/0905* (2013.01); *G03F 7/70075* (2013.01); *G03F 7/70108* (2013.01); *G03F 7/70116* (2013.01)

(58) Field of Classification Search
CPC ............ G02B 26/0833; G03F 7/70116; G03F 7/70075; G03F 7/70108
USPC ...................................... 355/67, 71; 359/237
See application file for complete search history.

(56) References Cited

U.S. PATENT DOCUMENTS

| 4,346,164 A | 8/1982 | Tabarelli et al. |
| 5,153,428 A | 10/1992 | Ellis |

(Continued)

FOREIGN PATENT DOCUMENTS

| CN | 1501175 A | 6/2004 |
| CN | 1573571 A | 2/2005 |

(Continued)

OTHER PUBLICATIONS

Written Opinion of the International Searching Authority from Intl. Appln. No. PCT/JP2008/069701.

(Continued)

*Primary Examiner* — Peter B Kim
(74) *Attorney, Agent, or Firm* — Oliff PLC

(57) ABSTRACT

To optionally forming a multilevel light intensity distribution on an illumination pupil plane, the illumination apparatus implements Köhler illumination on an illumination target surface, using as a light source the light intensity distribution formed on the illumination pupil plane on the basis of light from a light source. The illumination apparatus has a spatial light modulator, a condensing optical system, and a control unit. The spatial light modulator has a plurality of reflecting surfaces which are two-dimensionally arranged and postures of which can be controlled independently of each other. The condensing optical system condenses light from the reflecting surfaces to form a predetermined light intensity distribution on the illumination pupil plane. The control unit controls the number of reflecting surfaces contributing to arriving light, for each of points on the illumination pupil plane forming the light intensity distribution, according to a light intensity distribution to be formed on the illumination pupil plane.

32 Claims, 7 Drawing Sheets

(51) Int. Cl.
  *G02B 26/08*  (2006.01)
  *G02B 27/09*  (2006.01)
  *G03F 7/20*  (2006.01)

(56) References Cited

U.S. PATENT DOCUMENTS

| | | | |
|---|---|---|---|
| 5,216,541 A | 6/1993 | Takesue et al. | |
| 5,251,222 A | 10/1993 | Hester et al. | |
| 5,312,513 A | 5/1994 | Florence et al. | |
| 5,383,000 A | 1/1995 | Michaloski et al. | |
| 5,461,410 A | 10/1995 | Venkateswar et al. | |
| 5,850,310 A | 12/1998 | Schweizer | |
| 5,991,009 A | 11/1999 | Nishi et al. | |
| 6,406,148 B1 | 6/2002 | Marshall et al. | |
| 6,466,304 B1 | 10/2002 | Smith | |
| 6,577,379 B1 | 6/2003 | Boettiger et al. | |
| 6,577,429 B1 | 6/2003 | Kurtz et al. | |
| 6,665,119 B1 | 12/2003 | Kurtz et al. | |
| 6,737,662 B2 | 5/2004 | Mulder et al. | |
| 6,819,490 B2 | 11/2004 | Sandstrom et al. | |
| 6,829,090 B2 | 12/2004 | Katsumata et al. | |
| 6,844,927 B2 | 1/2005 | Stokowski et al. | |
| 6,885,493 B2 | 4/2005 | Ljungblad et al. | |
| 6,891,655 B2 | 5/2005 | Grebinski et al. | |
| 6,913,373 B2 | 7/2005 | Tanaka et al. | |
| 6,958,806 B2 | 10/2005 | Mulder et al. | |
| 6,958,867 B2 | 10/2005 | Ohmori et al. | |
| 6,960,035 B2 | 11/2005 | Okazaki et al. | |
| 6,961,116 B2 | 11/2005 | Den Boef et al. | |
| 6,977,718 B1 | 12/2005 | LaFontaine | |
| 7,015,491 B2 | 3/2006 | Eurlings et al. | |
| 7,030,962 B2 | 4/2006 | Iizuka et al. | |
| 7,061,226 B2 | 6/2006 | Durr | |
| 7,095,481 B2 | 8/2006 | Morohoshi | |
| 7,095,921 B2 | 8/2006 | Okazaki et al. | |
| 7,116,403 B2 | 10/2006 | Troost et al. | |
| 7,121,740 B2 | 10/2006 | Okazaki et al. | |
| 7,130,021 B2 | 10/2006 | Kobayashi | |
| 7,130,120 B2 | 10/2006 | Katsumata et al. | |
| 7,148,952 B2 | 12/2006 | Eurlings et al. | |
| 7,177,012 B2 | 2/2007 | Bleeker et al. | |
| 7,193,684 B2 | 3/2007 | Iizuka et al. | |
| 7,259,827 B2 | 8/2007 | Dierichs | |
| 7,289,276 B2 | 10/2007 | Ohmori et al. | |
| 7,400,382 B2 | 7/2008 | Baba-Ali et al. | |
| 7,423,731 B2 | 9/2008 | Tanitsu et al. | |
| 7,508,492 B2 | 3/2009 | Sekigawa et al. | |
| 7,525,642 B2 | 4/2009 | Mulder et al. | |
| 7,532,378 B2 | 5/2009 | Tanaka et al. | |
| 7,542,129 B2 | 6/2009 | Sandstrom | |
| 7,551,261 B2 | 6/2009 | Fiolka | |
| 7,573,052 B2 | 8/2009 | Inoue et al. | |
| 7,573,564 B2 | 8/2009 | Ruff et al. | |
| 7,580,559 B2 | 8/2009 | Latypov et al. | |
| 7,605,386 B2 | 10/2009 | Singer et al. | |
| 7,701,555 B2 | 4/2010 | Arai | |
| 7,714,983 B2 | 5/2010 | Koehler et al. | |
| 7,965,380 B2 | 6/2011 | Bleeker et al. | |
| 8,018,589 B2 | 9/2011 | MacKinnon et al. | |
| 2003/0038225 A1 | 2/2003 | Mulder et al. | |
| 2003/0071204 A1 | 4/2003 | Sandstrom et al. | |
| 2003/0098959 A1 | 5/2003 | Hagiwara et al. | |
| 2003/0214571 A1 | 11/2003 | Ishikawa et al. | |
| 2004/0053148 A1 | 3/2004 | Morohoshi | |
| 2004/0057034 A1 | 3/2004 | Zinn et al. | |
| 2004/0100629 A1 | 5/2004 | Stokowski et al. | |
| 2004/0108467 A1 | 6/2004 | Eurlings et al. | |
| 2004/0130775 A1 | 7/2004 | Grebinski | |
| 2004/0160582 A1 | 8/2004 | Lof et al. | |
| 2004/0207386 A1 | 10/2004 | Durr | |
| 2004/0239901 A1* | 12/2004 | Wasserman et al. ............ 355/53 | |
| 2005/0024612 A1 | 2/2005 | Hirukawa et al. | |
| 2005/0094122 A1 | 5/2005 | Hagiwara et al. | |
| 2005/0095749 A1 | 5/2005 | Krellmann et al. | |
| 2005/0141583 A1 | 6/2005 | Sandstrom | |
| 2005/0168790 A1 | 8/2005 | Latypov et al. | |
| 2005/0213068 A1 | 9/2005 | Ishii et al. | |
| 2005/0231703 A1* | 10/2005 | Kobayashi | 355/68 |
| 2005/0270515 A1 | 12/2005 | Troost et al. | |
| 2005/0281516 A1 | 12/2005 | Okazaki et al. | |
| 2006/0050261 A1 | 3/2006 | Brotsack | |
| 2006/0055834 A1 | 3/2006 | Tanitsu et al. | |
| 2006/0114446 A1 | 6/2006 | Gui | |
| 2006/0138349 A1 | 6/2006 | Bleeker et al. | |
| 2006/0175556 A1 | 8/2006 | Yabuki | |
| 2006/0176452 A1 | 8/2006 | Kim et al. | |
| 2006/0232841 A1 | 10/2006 | Toishi et al. | |
| 2006/0245033 A1* | 11/2006 | Baba-Ali et al. | 359/291 |
| 2007/0013888 A1 | 1/2007 | Flagello et al. | |
| 2007/0146676 A1 | 6/2007 | Tanitsu et al. | |
| 2007/0165202 A1 | 7/2007 | Koehler et al. | |
| 2007/0195305 A1 | 8/2007 | Mulder et al. | |
| 2007/0201338 A1 | 8/2007 | Yaoita et al. | |
| 2007/0273852 A1 | 11/2007 | Arai | |
| 2007/0273853 A1 | 11/2007 | Bleeker et al. | |
| 2007/0296936 A1 | 12/2007 | Kato et al. | |
| 2008/0021948 A1 | 1/2008 | Wilson et al. | |
| 2008/0079930 A1 | 4/2008 | Klarenbeek | |
| 2008/0095531 A1 | 4/2008 | Yeo et al. | |
| 2008/0239268 A1 | 10/2008 | Mulder et al. | |
| 2008/0259304 A1 | 10/2008 | Dierichs | |
| 2009/0021656 A1 | 1/2009 | Ozaki | |
| 2009/0033902 A1 | 2/2009 | Mulder et al. | |
| 2009/0073411 A1 | 3/2009 | Tanitsu | |
| 2009/0091730 A1 | 4/2009 | Tanaka | |
| 2009/0097007 A1 | 4/2009 | Tanaka | |
| 2009/0097094 A1 | 4/2009 | Tanaka | |
| 2009/0109417 A1 | 4/2009 | Tanitsu | |
| 2009/0128886 A1 | 5/2009 | Hirota | |
| 2009/0147247 A1 | 6/2009 | Endo et al. | |
| 2009/0174877 A1 | 7/2009 | Mulder et al. | |
| 2009/0263736 A1 | 10/2009 | Inoue et al. | |
| 2010/0195077 A1 | 8/2010 | Koehler et al. | |
| 2012/0202157 A1 | 8/2012 | Tanitsu | |
| 2012/0236284 A1 | 9/2012 | Tanaka | |

FOREIGN PATENT DOCUMENTS

| | | |
|---|---|---|
| CN | 1601322 A | 3/2005 |
| CN | 1879062 A | 12/2006 |
| DE | 206 607 | 2/1984 |
| DE | 221 563 A1 | 4/1985 |
| DE | 224 448 A1 | 7/1985 |
| DE | 242 880 A1 | 2/1987 |
| DE | 196 35 792 A1 | 4/1997 |
| DE | 100 29 938 A1 | 7/2001 |
| DE | 103 43 333 A1 | 4/2005 |
| EP | 0 023 231 A1 | 2/1981 |
| EP | 0 208 552 A2 | 1/1987 |
| EP | 0 656 555 A1 | 6/1995 |
| EP | 0 764 858 A2 | 3/1997 |
| EP | 1 109 067 A2 | 6/2001 |
| EP | 1 211 561 A2 | 6/2002 |
| EP | 1 262 836 A1 | 12/2002 |
| EP | 1 280 007 A2 | 1/2003 |
| EP | 1 395 049 A1 | 3/2004 |
| EP | 1 489 462 A2 | 12/2004 |
| EP | 1 674 935 A2 | 6/2006 |
| EP | 1 798 758 A1 | 6/2007 |
| EP | 1 882 895 A1 | 1/2008 |
| EP | 1 993 120 A1 | 11/2008 |
| FR | 2 474 708 | 7/1981 |
| JP | A-44-4993 | 2/1969 |
| JP | A-56-5666 | 1/1981 |
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |

(56) References Cited

FOREIGN PATENT DOCUMENTS

| | | |
|---|---|---|
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A 05-013292 | 1/1993 |
| JP | A-5-21314 | 1/1993 |
| JP | A-5-45886 | 2/1993 |
| JP | A-5-62877 | 3/1993 |
| JP | A-5-90128 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | A-5-160002 | 6/1993 |
| JP | A-5-175098 | 7/1993 |
| JP | A-5-199680 | 8/1993 |
| JP | A-5-217837 | 8/1993 |
| JP | A-5-217840 | 8/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-6-29102 | 4/1994 |
| JP | A-6-97269 | 4/1994 |
| JP | A-6-104167 | 4/1994 |
| JP | A-6-120110 | 4/1994 |
| JP | 6-124873 A | 5/1994 |
| JP | A-6-36054 | 5/1994 |
| JP | A-6-124126 | 5/1994 |
| JP | A-6-124872 | 5/1994 |
| JP | A-6-124873 | 5/1994 |
| JP | A-6-140306 | 5/1994 |
| JP | A-6-148399 | 5/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-6-188169 | 7/1994 |
| JP | A-6-196388 | 7/1994 |
| JP | A-6-204113 | 7/1994 |
| JP | A 06-204121 | 7/1994 |
| JP | A-6-204121 | 7/1994 |
| JP | A-6-229741 | 8/1994 |
| JP | A-6-241720 | 9/1994 |
| JP | A-6-244082 | 9/1994 |
| JP | A-6-267825 | 9/1994 |
| JP | 6-291023 A | 10/1994 |
| JP | A-6-283403 | 10/1994 |
| JP | A-06-291023 | 10/1994 |

(56) References Cited

FOREIGN PATENT DOCUMENTS

| | | |
|---|---|---|
| JP | A-6-310399 | 11/1994 |
| JP | A-6-325894 | 11/1994 |
| JP | A-6-326174 | 11/1994 |
| JP | A-6-349701 | 12/1994 |
| JP | A-7-69621 | 3/1995 |
| JP | A-7-92424 | 4/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | A-7-147223 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | 8-313842 A | 11/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-215208 | 9/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | 10-303114 A | 11/1998 |
| JP | A-10-294268 | 11/1998 |
| JP | A-10-303114 | 11/1998 |
| JP | A-10-340846 | 12/1998 |
| JP | 11-003849 A | 1/1999 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |

(56) References Cited

FOREIGN PATENT DOCUMENTS

| | | |
|---|---|---|
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-121498 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | A-2002-66428 | 3/2002 |
| JP | A-2002-71513 | 3/2002 |
| JP | A-2002-75816 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | 2002-353105 A | 12/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |
| JP | A-2002-367523 | 12/2002 |
| JP | A-2002-367886 | 12/2002 |
| JP | A-2002-373849 | 12/2002 |
| JP | 2003-022967 A | 1/2003 |
| JP | A-2003-15040 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59286 | 2/2003 |
| JP | A-2003-59803 | 2/2003 |
| JP | A-2003-59821 | 2/2003 |
| JP | A-2003-68600 | 3/2003 |
| JP | A-2003-75703 | 3/2003 |
| JP | A-2003-81654 | 3/2003 |
| JP | A-2003-84445 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A-2003-173957 | 6/2003 |
| JP | A-2003-188087 | 7/2003 |
| JP | A 2003-195223 | 7/2003 |
| JP | A-2003-224961 | 8/2003 |
| JP | A-2003-229347 | 8/2003 |
| JP | A-2003-233001 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |

(56) References Cited

FOREIGN PATENT DOCUMENTS

| | | |
|---|---|---|
| JP | A 2003-279889 | 10/2003 |
| JP | A-2003-282423 | 10/2003 |
| JP | A-2003-297727 | 10/2003 |
| JP | A-2003-532218 | 10/2003 |
| JP | A-2003-532282 | 10/2003 |
| JP | A-2003-311923 | 11/2003 |
| JP | A 2004-006440 | 1/2004 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-85612 | 3/2004 |
| JP | A-2004-87987 | 3/2004 |
| JP | A 2004-093624 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-111569 | 4/2004 |
| JP | A-2004-111579 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-221253 | 8/2004 |
| JP | A-2004-224421 | 8/2004 |
| JP | A-2004-228497 | 8/2004 |
| JP | A 2004-233897 | 8/2004 |
| JP | A-2004-241666 | 8/2004 |
| JP | A-2004-247527 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-260115 | 9/2004 |
| JP | 2004-304135 A | 10/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-355006 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-11990 | 1/2005 |
| JP | A-2005-12228 | 1/2005 |
| JP | A 2005-018013 | 1/2005 |
| JP | A-2005-19628 | 1/2005 |
| JP | A-2005-19864 | 1/2005 |
| JP | A-2005-26634 | 1/2005 |
| JP | A 2005-503018 | 1/2005 |
| JP | A 2005-032909 | 2/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-93948 | 4/2005 |
| JP | A-2005-97057 | 4/2005 |
| JP | A-2005-108934 | 4/2005 |
| JP | A-2005-114882 | 4/2005 |
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A 2005-136422 | 5/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-223328 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A 2005-243870 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302825 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A 2005-537658 | 12/2005 |
| JP | A-2006-1821 | 1/2006 |
| JP | A-2006-5197 | 1/2006 |
| JP | A 2006-013518 | 1/2006 |
| JP | A-2006-17895 | 1/2006 |
| JP | A-2006-19702 | 1/2006 |
| JP | A-2006-24706 | 1/2006 |
| JP | A-2006-24819 | 1/2006 |
| JP | 2006-054328 A | 2/2006 |

(56) References Cited

FOREIGN PATENT DOCUMENTS

| | | |
|---|---|---|
| JP | A-2006-32750 | 2/2006 |
| JP | A 2006-032963 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-508369 | 3/2006 |
| JP | A-2006-100363 | 4/2006 |
| JP | A-2006-100686 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A 2006-135312 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-516724 | 7/2006 |
| JP | A 2006-228718 | 8/2006 |
| JP | A 2006-519494 | 8/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A 2006-284740 | 10/2006 |
| JP | A-2006-289684 | 10/2006 |
| JP | A-2006-309243 | 11/2006 |
| JP | A 2006-344747 | 12/2006 |
| JP | A-2006-349946 | 12/2006 |
| JP | A-2006-351586 | 12/2006 |
| JP | A-2007-5830 | 1/2007 |
| JP | A 2007-019079 | 1/2007 |
| JP | A-2007-43980 | 2/2007 |
| JP | A-2007-48819 | 2/2007 |
| JP | A-2007-51300 | 3/2007 |
| JP | A 2007-505488 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A 2007-150295 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A 2007-227918 | 9/2007 |
| JP | A-2007-235041 | 9/2007 |
| JP | A 2007-258691 | 10/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A 2008-047744 | 2/2008 |
| JP | A-2008-58580 | 3/2008 |
| JP | A-2008-64924 | 3/2008 |
| JP | A-2008-102134 | 5/2008 |
| JP | A-2008-103737 | 5/2008 |
| JP | A-2008-180492 | 8/2008 |
| JP | A 2008-258605 | 10/2008 |
| JP | A-2009-17540 | 1/2009 |
| JP | A-2009-60339 | 3/2009 |
| JP | A 2009-105396 | 5/2009 |
| JP | A 2009-111369 | 5/2009 |
| JP | A 2009-117801 | 5/2009 |
| JP | A 2009-117812 | 5/2009 |
| JP | A 2010-034486 | 2/2010 |
| WO | WO 97/11411 A1 | 3/1997 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 A1 | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/11706 A1 | 3/2000 |
| WO | WO 00/67303 | 4/2000 |
| WO | WO 00/67303 | 11/2000 |
| WO | WO 01/03170 A1 | 1/2001 |
| WO | WO 01/10137 A1 | 2/2001 |
| WO | WO 01/22480 A1 | 3/2001 |
| WO | WO 01/27978 A1 | 4/2001 |
| WO | WO 01/59502 A1 | 8/2001 |
| WO | WO 01/65296 A1 | 9/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/101804 A1 | 12/2002 |
| WO | WO 02/103766 A1 | 12/2002 |
| WO | WO 03/023832 A1 | 3/2003 |
| WO | WO 03/023833 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051220 A2 | 6/2004 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/061488 A1 | 7/2004 |
| WO | WO 2004/071070 A2 | 8/2004 |
| WO | WO 2004/077164 A1 | 9/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 A1 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/029559 A1 | 3/2005 |
| WO | WO 2005/036619 A1 | 4/2005 |
| WO | WO 2005/036620 A1 | 4/2005 |
| WO | WO 2005-036622 A1 | 4/2005 |
| WO | WO 2005-036623 A1 | 4/2005 |
| WO | WO 2005/041276 A1 | 5/2005 |
| WO | WO 2005/048325 A1 | 5/2005 |
| WO | WO 2005/048326 A1 | 5/2005 |
| WO | WO 2005/057636 A1 | 6/2005 |
| WO | WO 2005/067013 A1 | 7/2005 |
| WO | WO 2005/071717 A1 | 8/2005 |

(56) References Cited

FOREIGN PATENT DOCUMENTS

| | | |
|---|---|---|
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006-006730 A1 | 1/2006 |
| WO | WO 2006-016551 A1 | 2/2006 |
| WO | WO 2006/019124 A1 | 2/2006 |
| WO | WO 2006-025341 A1 | 3/2006 |
| WO | WO 2006-028188 A1 | 3/2006 |
| WO | WO 2006-030727 A1 | 3/2006 |
| WO | WO 2006/030910 A1 | 3/2006 |
| WO | WO 2006/035775 A1 | 4/2006 |
| WO | WO 2006-049134 A1 | 5/2006 |
| WO | WO 2006/051909 A1 | 5/2006 |
| WO | WO 2006-064851 A1 | 6/2006 |
| WO | WO 2006-068233 A1 | 6/2006 |
| WO | WO 2006-077958 A1 | 7/2006 |
| WO | WO 2006/080285 A | 8/2006 |
| WO | WO 2006/085524 A1 | 8/2006 |
| WO | WO 2006/085626 A1 | 8/2006 |
| WO | WO 2006/097135 A1 | 9/2006 |
| WO | WO 2006/100889 A1 | 9/2006 |
| WO | WO 2006-118108 A1 | 11/2006 |
| WO | WO 2007/003563 A1 | 1/2007 |
| WO | WO 2007/004567 A1 | 1/2007 |
| WO | WO 2007-018127 A1 | 2/2007 |
| WO | WO 2007/055237 A1 | 5/2007 |
| WO | WO 2007/055373 A1 | 5/2007 |
| WO | WO 2007/058188 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/100081 A1 | 9/2007 |
| WO | WO 2007/132862 A1 | 11/2007 |
| WO | WO 2007/141997 A1 | 12/2007 |
| WO | WO 2008/015973 A1 | 2/2008 |
| WO | WO 2008/041575 A1 | 4/2008 |
| WO | WO 2008/059748 A1 | 5/2008 |
| WO | WO 2008/061681 A2 | 5/2008 |
| WO | WO 2006-343023 | 6/2008 |
| WO | WO 2008/065977 A1 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/131928 A1 | 11/2008 |
| WO | WO 2008/139848 A1 | 11/2008 |
| WO | WO 2009/026947 A1 | 3/2009 |
| WO | WO 2009/034109 A2 | 3/2009 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Office Action dated Jul. 19, 2011 in U.S. Appl. No. 12/191,821.
Office Action dated Jul. 28, 2011 in U.S. Appl. No. 12/252,283.
Office Action dated Jul. 5, 2011 in Chinese Patent Application No. 200880100940.0.
Office Action dated Jun. 30, 2011 in Chinese Patent Application No. 200880021453.5.
Office Action dated Jul. 26, 2011 in Chinese Patent Application No. 200880020867.6.
Office Action dated Jul. 12, 2011 in Chinese Patent Application No. 200880018312.8.
Jan. 15, 2009 International Search Report issued in International Application No. PCT/JP2008/068319.
Mar. 25, 2009 International Search Report issued in International Application No. PCT/JP2008/066803.
Jan. 16, 2009 Invitation to Pay Additional Fees Relating to the results of the Partial International Search Report issued in International Application No. PCT/JP2008/066803.
May 25, 2009 International Search Report issued in International Application No. PCT/JP2008/069704.
Mar. 6, 2009 Invitation to Pay Additional Fees Relating to the results of the Partial International Search Report issued in International Application No. PCT/JP2008/069704.
Jan. 26, 2009 International Search Report issued in International Application No. PCT/JP2008/068909.
Apr. 6, 2009 International Search Report issued in International Application No. PCT/JP2008/070253.
Mar. 2, 2009 International Search Report issued in International Application No. PCT/JP2008/069701.
Dec. 9, 2010 European Search Report issued in European Application No. 09015719.9.
Dec. 9, 2010 European Search Report issued in European Application No. 09015716.5.
Dec. 9, 2010 Partial European Search Report issued in European Application No. 09015718.1.
Oct. 15, 2010 Office Action issued in European Application No. 08 835 135.8.
Feb. 22, 2011 Office Action issued in European Application No. 08 830 323.5.
Dec. 8, 2010 Office Action issued in European Application No. 08 841 021.2.
Jun. 25, 2010 Office Action issued in European Application No. 08 837 064.8.
Mar. 24, 2011 Office Action issued in Chinese Application No. 200880024806.7 (with translation).
Feb. 20, 2012 Second Office Action issued in Chinese Patent Application No. 200880018312.8 (with translation).
May 18, 2011 Office Action issued in U.S. Appl. No. 12/208,155.
Jul. 27, 2011 Office Action issued in U.S. Appl. No. 12/208,155.
Mar. 24, 2011 Office Action issued in U.S. Appl. No. 12/191,821.
Aug. 26, 2011 Office Action issued in U.S. Appl. No. 12/245,021.
Jul. 18, 2011 Office Action issued in U.S. Appl. No. 12/250,519.
Jan. 3, 2011 Office Action issued in U.S. Appl. No. 12/262,930.
May 13, 2011 Office Action issued in U.S. Appl. No. 12/952,197.
Mar. 31, 2011 Notice of Allowance issued in U.S. Appl. No. 12/252,274.
Sep. 1, 2010 Office Action issued in U.S. Appl. No. 12/252,274.
Feb. 24, 2012 Notice of Allowance issued in U.S. Appl. No. 12/252,283.
Gao et al., "Research on high-quality projecting reduction lithography system based on digital mask technique", Aug. 17, 2005, vol. 116, No. 7, pp. 303-310.
Jun. 20, 2012 Office Action issued in Chinese Patent Application No. 200880100940.0 (with translation).
Jul. 17, 2012 Office Action issued in U.S. Appl. No. 12/250,519.
Notice of Allowance dated Nov. 28, 2011 in U.S. Appl. No. 12/952,197.
Office Action dated Nov. 15, 2011 in U.S. Appl. No. 12/252,274.
Office Action dated Nov. 3, 2011 in Chinese Patent Application No. 200880015567.9.
Office Action dated Dec. 12, 2011 in European Patent Application No. 08 837 064.8.
Office Action dated Nov. 17, 2011 in Chinese Patent Application No. 200880024375.4.
May 9, 2012 Office Action issued in European Patent Application No. 08830323.5.
Feb. 22, 2012 Office Action issued in Chinese Patent Application No. 200880020867.6 (with English translation).
May 29, 2012 Office Action issued in U.S. Appl. No. 13/417,602.
May 23, 2012 Notice of Allowance issued in U.S. Appl. No. 12/191,821.
Office Action dated Nov. 7, 2011 in U.S. Appl. No. 12/250,519.
Dec. 20, 2011 Office Action issued in CN Application No. 200980101546.3 (with English translation).
Feb. 7, 2012 Notice of Allowance issued in U.S. Appl. No. 12/191,821.
Dec. 15, 2011 Notice of Allowance issued in U.S. Appl. No. 12/245,021.
Notice of Reasons for Rejection issued Nov. 20, 2012 in Japanese Application No. P2008-261214 (with translation).
Notice of Reasons for Rejection issued Nov. 20, 2012 in Japanese Application No. P2008-261215 (with translation).

(56) References Cited

OTHER PUBLICATIONS

Notice of Allowance issued Nov. 27, 2012 in U.S. Appl. No. 12/252,274.
Office Action issued Dec. 18, 2012 in U.S. Appl. No. 12/250,519.
Dec. 26, 2012 Office Action issued in Chinese Patent Application No. 200980101546.3 (with translation).
Notice of Allowance issued Jan. 16, 2013 in U.S. Appl. No. 13/417,602.
Notice of Allowance issued Jan. 15, 2013 in U.S. Appl. No. 12/191,821.
Notice of Allowance issued Jan. 23, 2013 in U.S. Appl. No. 12/952,197.
Notice of Allowance issued Jan. 23, 2013 in U.S. Appl. No. 12/252,283.
Notice of Reasons for Rejection issued Jan. 15, 2013 in Japanese Patent Application No. 2008-259522 (with translation).
Office Action issued Jan. 31, 2013 in Chinese Patent Application No. 200880021453.5 (with translation).
Mar. 11, 2013 Office Action issued in European Patent Application No. 08847031.5.
Mar. 19, 2013 Office Action issued in European Patent Application No. 08830323.5.
Feb. 19, 2013 Office Action issued in Japanese Patent Application No. P2010-514429 (with translation).
Mar. 12, 2013 Office Action issued in Chinese Patent Application No. 200880024806.7 (with translation).
Apr. 5, 2013 Notice of Allowance issued in U.S. Appl. No. 13/484,051.
Apr. 29, 2013 Notice of Allowance issued in U.S. Appl. No. 12/252,274.
May 10, 2013 Office Action issued in European Patent Application No. 12171299.6.
Apr. 3, 2013 Office Action issued in Chinese Patent Application No. 200880100940.0 (with translation).
Jul. 27, 2012 Search Report issued in European Patent Application No. 12171299.6.
Jun. 18, 2012 Office Action issued in Chinese Patent Application No. 200880021453.5 (with translation).
Aug. 14, 2012 Notice of Allowance issued in U.S. Appl. No. 12/252,274.
Jul. 26, 2012 Office Action issued in Chinese Patent Application No. 200880020867.6 (with translation).
Aug. 24, 2012 Notice of Allowance issued in U.S. Appl. No. 12/245,021.
Office Action issued Sep. 14, 2012 in U.S. Appl. No. 13/484,051.
Search Report issued Oct. 2, 2012 in European Patent Application No. 12173803.3.
Notice of Allowance issued Sep. 28, 2012 in U.S. Appl. No. 12/252,283.
Office Action issued Oct. 17, 2012 in European Patent Application No. 08 841 021.2.
Office Action issued Oct. 17, 2012 in European Patent Application No. 09 015 716.5.
Search Report issued Oct. 18, 2012 in European Patent Application No. 09015718.1.
Office Action issued Oct. 10, 2012 in Chinese Patent Application No. 200880015567.9 (with English-language translation).
Search Report issued Oct. 30, 2012 in European Patent Application No. 12173802.5.
Search Report issued Sep. 21, 2012 in European Patent Application No. 12173801.7.
Notice of Allowance issued Oct. 23, 2012 in Japanese Patent Application No. P2008-263405 (with translation).
Jun. 17, 2013 Office Action issued in European Patent Application No. 12 173 802.5.
May 14, 2013 Office Action issued in Japanese Patent Application No. P2010-506474 (with translation).
Apr. 30, 2014 Office Action issued in Taiwanese Patent Application No. 097142739 (w/English Translation).
Aug. 27, 2014 Office Action issued in Korean Application No. 10-2010-7012430 (with English translation).
Jun. 16, 2015 Office Action issued in Korean Patent Application No. 10-2015-7005338.

\* cited by examiner

ILLUMINATION APPARATUS, ILLUMINATION METHOD, EXPOSURE APPARATUS, AND DEVICE MANUFACTURING METHOD

CROSS-REFERENCE TO RELATED APPLICATION

This application is based upon and claims the benefit of priority (priorities) from Provisional Application No. 60/996,295 filed on Nov. 9, 2007, the entire contents of which are incorporated herein by reference.

BACKGROUND OF THE INVENTION

1. Field of the Invention

An embodiment of the present invention relates to an illumination apparatus incorporating a spatial modulation unit for generating a predetermined light intensity distribution (pupil luminance distribution) on an illumination pupil plane on the basis of light from a light source, an illumination method using the spatial modulation unit, an exposure apparatus incorporating the illumination apparatus, and a device manufacturing method using the exposure apparatus.

2. Related Background Art

A reflection-type spatial light modulator is hitherto known as a spatial modulator to form a pupil luminance distribution for modified illumination (e.g., a dipolar, quadrupolar, or other distribution) in exposure apparatus. Such a reflection-type spatial light modulator is described, for example, in Japanese Patent Application Laid-open No. 2002-353105 (Document 1).

There is also a recent trend to demand multilevel (3- or more-valued) distributions rather than a simple binary (presence/absence of light) distribution, as pupil luminance distributions for modified or off-axis illumination (e.g., cf. Patent Document 2: U.S. Pat. No. 6,466,304). In Document 2, a multilevel pupil luminance distribution is obtained by placing a spatial filter with a number of transparent regions composed of a semitransparent substrate and a masking film, in the illumination pupil plane.

SUMMARY OF THE INVENTION

The inventor studied the foregoing conventional technology and found the following problem.

Specifically, the above-cited Document 1 discloses nothing about formation of the multilevel pupil luminance distribution. Since the technology in the above-cited Document 2 uses the spatial filter to obtain the multilevel pupil luminance distribution, it fails to obtain a multilevel pupil luminance distribution in which luminances (light intensities) in respective zones on the illumination pupil plane are optionally controlled.

An embodiment of the present invention has been accomplished in order to solve the problem as described above, and provides an illumination apparatus and illumination method with a structure capable of forming a multilevel pupil luminance distribution in which luminances in respective zones on the illumination pupil plane are optionally controlled, and to provide an exposure apparatus incorporating the illumination apparatus and a device manufacturing method using the exposure apparatus.

An embodiment of the present invention provides an illumination apparatus and illumination method which are configured to form a predetermined light intensity distribution on an illumination pupil plane on the basis of light from a light source, and to implement Köhler illumination on an illumination target surface using the predetermined light intensity distribution as a light source.

In order to achieve the above object, an embodiment of the present invention provides an illumination apparatus which comprises a spatial light modulator, a condensing optical system, and a control unit. The spatial light modulator has a plurality of reflecting surfaces whose postures are controlled independently of each other. These reflecting surfaces are two-dimensionally arranged on an optical path of light traveling from a light source to an illumination pupil plane. The condensing optical system are arranged in a light path of light from the reflecting surfaces of the spatial light modulator to form a predetermined light intensity distribution on the illumination pupil plane. The condensing optical system condenses light from the reflecting surfaces of the spatial light modulator to form a predetermined light intensity distribution on the illumination pupil plane. The control unit feeds a control signal to the spatial light modulator in accordance with a light intensity distribution to be formed on the illumination pupil plane.

Particularly, in an embodiment of the illumination apparatus, the condensing optical system converts light provided with a predetermined angle distribution by the reflecting surfaces of the spatial light modulator, into a position distribution on the illumination pupil plane. The control unit controls a number of the reflecting surfaces contributing to arriving light, for each of points on the illumination pupil plane constituting the light intensity distribution.

An embodiment of the present invention provides an illumination method which comprises arrangement of a plurality of reflecting surfaces, arrangement of a condensing optical system, and posture control of the reflecting surfaces. The postures of the respective reflecting surfaces are controlled independently of each other and the reflecting surfaces are two-dimensionally arranged on an optical path of light traveling from a light source to an illumination pupil plane. The condensing optical system is arranged on an optical path of light traveling from the reflecting surfaces to the illumination pupil plane and functions to convert light provided with a predetermined angle distribution by the reflecting surfaces, into a position distribution on the illumination pupil plane. The posture control of the reflecting surfaces comprises first controlling a number of the reflecting surfaces contributing to arriving light, for each of points on the illumination pupil plane constituting the light intensity distribution, when the predetermined light intensity distribution is formed on the illumination pupil plane by condensing the light from the reflecting surfaces by the condensing optical system. The posture control is carried out for each group of reflecting surfaces controlled in this manner.

An embodiment of the present invention provides an exposure apparatus which comprises the illumination apparatus with the structure as described above (an embodiment of the illumination apparatus according to the present invention) for illuminating a predetermined pattern, and performs exposure of the predetermined pattern on a photosensitive substrate.

An embodiment of the present invention provides a device manufacturing method which is to manufacture a desired device, using the exposure apparatus with the structure as described above (an embodiment of the exposure apparatus according to the present invention). Specifically, the device manufacturing method comprises an exposure block, a development block, and a processing block. The exposure block is to effect the exposure of the predetermined pattern on the photosensitive substrate, using the exposure apparatus with the structure as described above. The development block is to develop the photosensitive substrate onto which the predetermined pattern has been transferred, and thereafter to form a mask layer in a shape corresponding to the predetermined pattern on a surface of the photosensitive substrate. The processing block is to process the surface of the photosensitive substrate through the mask layer.

BRIEF DESCRIPTION OF THE DRAWINGS

A general architecture that implements the various features of the invention will now be described with reference to the drawings. The drawings and the associated descriptions are provided to illustrate embodiments of the invention and not to limit the scope of the invention.

DESCRIPTION OF THE PREFERRED EMBODIMENTS

In the following, embodiments of the illumination apparatus, illumination method, exposure apparatus, and device manufacturing method according to the present invention will be described below in detail with reference to FIGS. 1 to 3, 3A to 3D, 4, 5A, 5B and 6 to 7. In the description of the drawings, the same portions and the same elements will be denoted by the same reference symbols, without redundant description.

Figure 1:
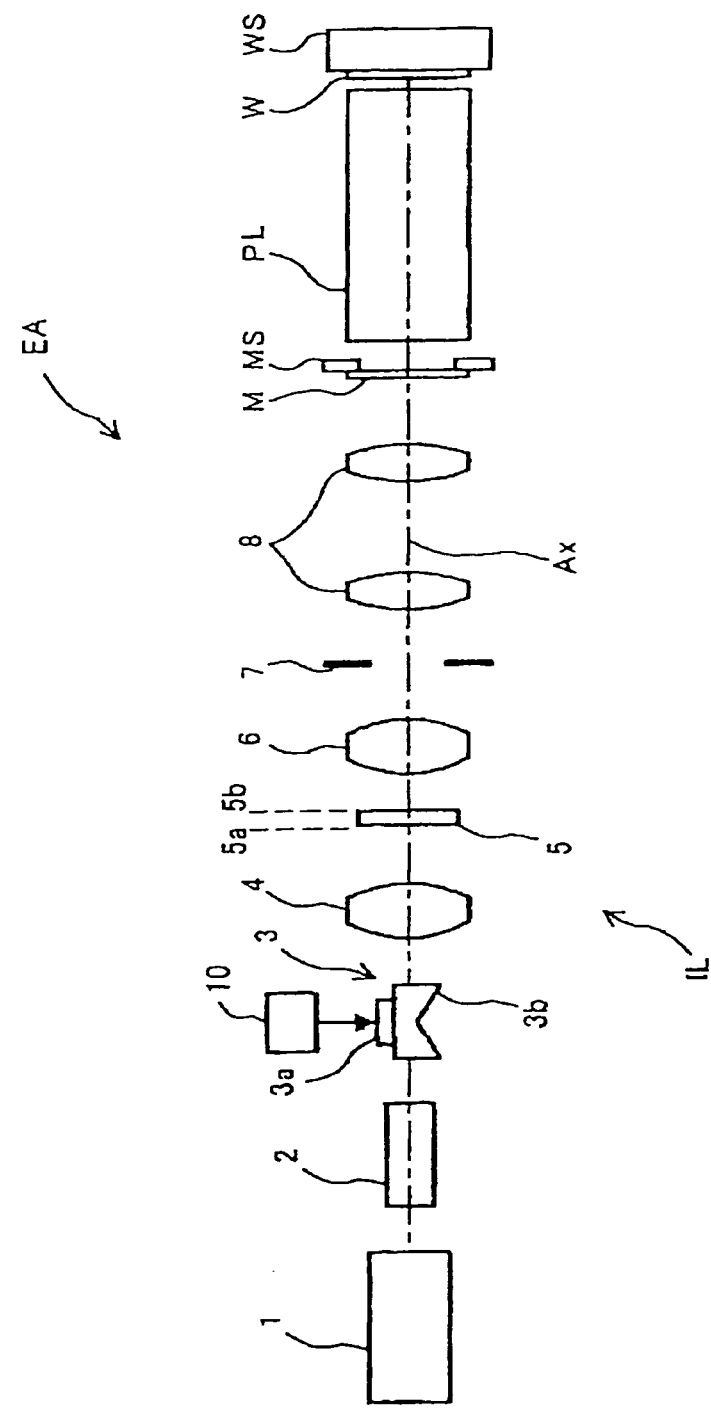
FIG. 1 is a drawing schematically showing a configuration of the exposure apparatus according to an embodiment of the present invention.

FIG. 1 is a drawing schematically showing a configuration of the exposure apparatus according to an embodiment of the present invention. In FIG. 1, the Z-axis is set along a direction of a normal to a wafer W being a photosensitive substrate, the Y-axis along a direction parallel to the plane of FIG. 1 in a plane of the wafer W, and the X-axis along a direction normal to the plane of FIG. 1 in the plane of the wafer W.

Referring to FIG. 1, the exposure apparatus EA has an illumination apparatus IL, a mask stage MS supporting a mask M, a projection optical system PL, and a wafer stage WS supporting the wafer W. The illumination apparatus IL has a light source 1 and a spatial light modulation unit 3 arranged in the order named along the optical axis AX of the exposure apparatus EA. The exposure apparatus EA is configured to illuminate the mask M by means of the illumination apparatus IL on the basis of light from the light source 1 and to project an image of a surface with a pattern thereon (first surface) of the mask M, onto a surface on the wafer W (second surface) by means of the projection optical system PL. The illumination apparatus IL, which illuminates the surface with the pattern thereon (first surface) of the mask M with the light supplied from the light source 1, implements modified illumination (off-axis illumination), e.g., dipole, quadrupole, or other illumination by means of the spatial light modulation unit 3.

The illumination apparatus IL has a polarization control unit 2, a spatial light modulation unit 3, a zoom optical system 4, a fly's eye lens 5, a condenser optical system 6, an illumination field stop (mask blind) 7, and a field stop imaging optical system 8 along the optical axis AX.

The spatial light modulation unit 3 forms a desired pupil luminance distribution (pupil intensity distribution) in its far field (Fraunhofer diffraction region), based on the light from the light source 1 having traveled through the polarization control unit 2. A spatial light modulator 3a of the spatial light modulation unit 3 is composed of a large number of mirror elements as described below, and the illumination apparatus IL also has a control unit 10 which outputs a control signal for controlling inclinations of these mirror elements, to the spatial light modulator 3a.

The polarization control unit 2 is disclosed, for example, in U.S. Patent Published Application No. 2006/0055834A1. The teachings of the U.S. Patent Published Application No. 2006/0055834A1 are incorporated by reference.

The fly's eye lens 5 divides the wavefront of incident light and forms a secondary light source consisting of light source images as many as lens elements thereof on the rear focal plane of the fly's eye lens 5. The fly's eye lens 5 applicable herein is, for example, a cylindrical micro fly's eye lens. Such a cylindrical micro fly's eye lens is disclosed, for example, in U.S. Pat. No. 6,913,373. The teachings of the U.S. Pat. No. 6,913,373 are incorporated by reference.

In the exposure apparatus EA of the present embodiment, the mask M disposed on an illumination target surface is subjected to Köhler illumination, using the secondary light source formed by the fly's eye lens 5, as a light source. Therefore, the plane where this secondary light source is formed becomes a plane conjugate with an aperture stop of the projection optical system PL and thus can be called an illumination pupil plane of the illumination apparatus IL. Typically, the illumination target surface (the surface where the mask M is arranged or the surface where the wafer W is arranged) becomes an optical Fourier transform surface with respect to the illumination pupil plane.

The pupil luminance distribution (which is also referred to as a pupil intensity distribution) is a light intensity distribution on the illumination pupil plane of the illumination apparatus IL or on a plane conjugate with the illumination pupil plane. However, when the number of wavefront divisions by the fly's eye lens 5 is large, there is a high correlation between the global light intensity distribution formed on the entrance plane of the fly's eye lens 5 and the global light intensity distribution of the entire secondary light source, and, therefore, the light intensity distributions on the entrance plane of the fly's eye lens 5 and on the plane conjugate with the entrance plane can also be called pupil luminance distributions.

The condenser optical system 6 condenses beams of light emitted from the fly's eye lens 5 and thereafter the condensed beams illuminate the illumination field stop 7 in a superimposed manner. The light from the illumination field stop 7 travels through the field stop imaging optical system 8 to reach the mask M with the predetermined pattern thereon and to form an illumination region as an image of an aperture of the illumination field stop 7 in at least a part of the pattern-formed region of the mask M. FIG. 1 is depicted without any path bending mirror for bending the optical axis AX, but it is possible to arrange a path bending mirror or path bending mirrors as occasion may demand. The mask M is mounted on the mask stage MS.

The projection optical system PL forms an image of the first surface on a projection surface (second surface) Wa of the wafer W mounted on the wafer stage WS, based on light from the illumination region formed on the pattern surface (first surface) of the mask M by the illumination apparatus IL.

In this manner, one-shot exposure or scan exposure is carried out while two-dimensionally driving and controlling the wafer stage WS and, therefore, two-dimensionally driving and controlling the wafer W, in the plane (X-Y plane) perpendicular to the optical axis AX of the projection optical system PL. This causes the pattern of the mask M to be sequentially transferred into each of exposure areas on the wafer W.

Figure 2:
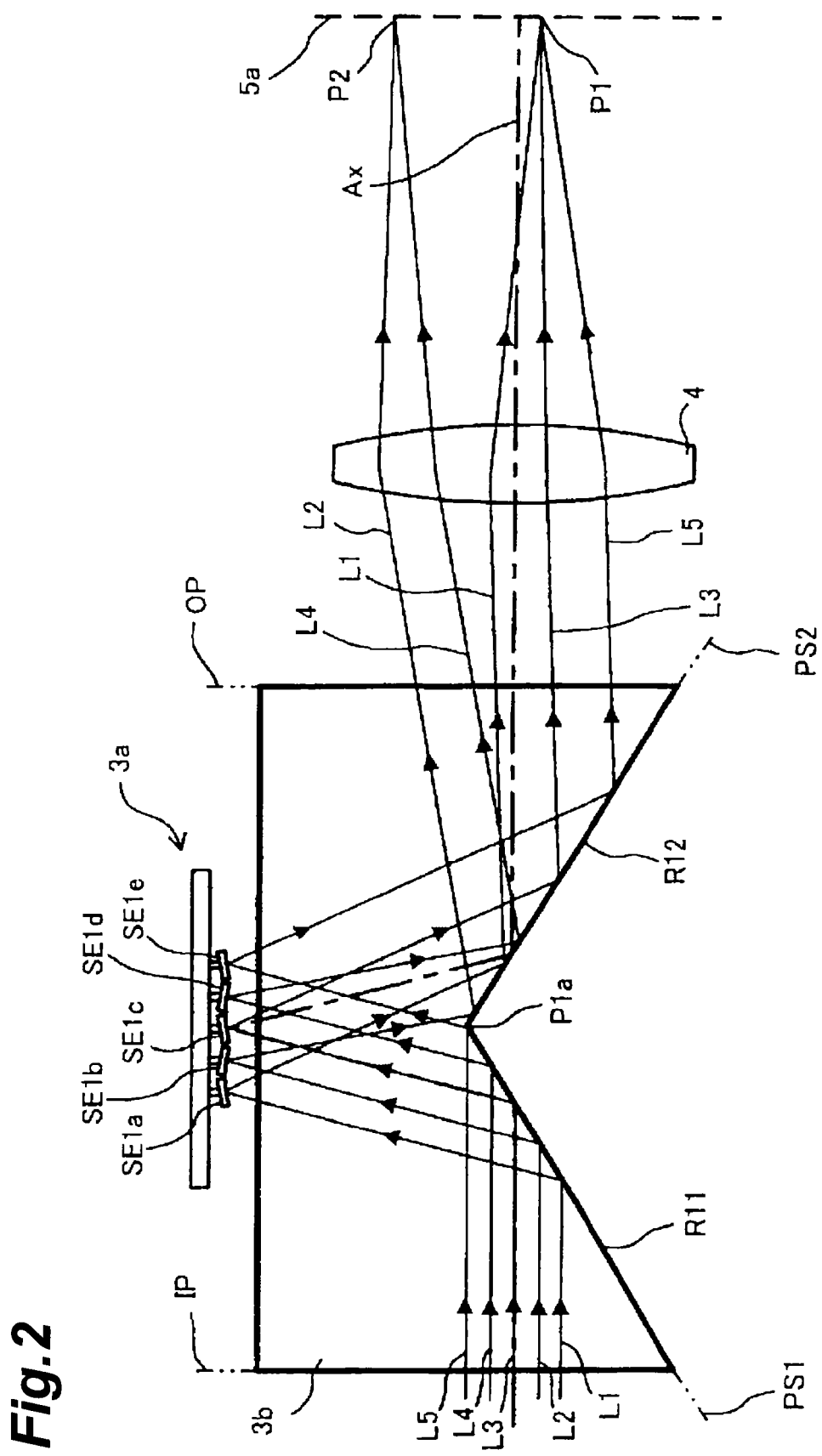
FIG. 2 is an optical path diagram showing arrangement of a spatial light modulator and a condensing optical system, as a major part of the illumination apparatus and illumination method according to an embodiment of the present invention.
Figure 3A:
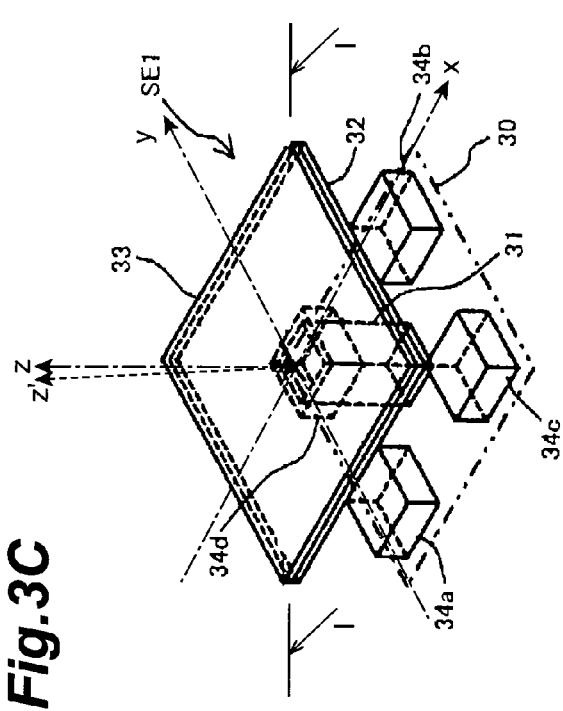
FIGS. 3A to 3D are drawings schematically showing a configuration of the spatial light modulator shown in FIG. 2.
Figure 3B:
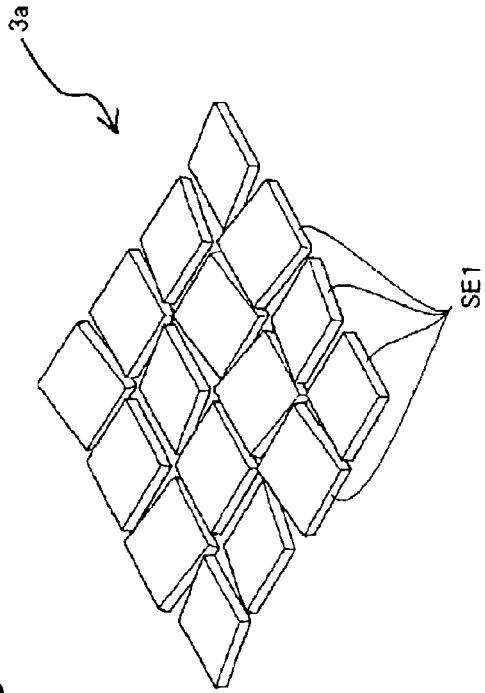
Figure 3C:
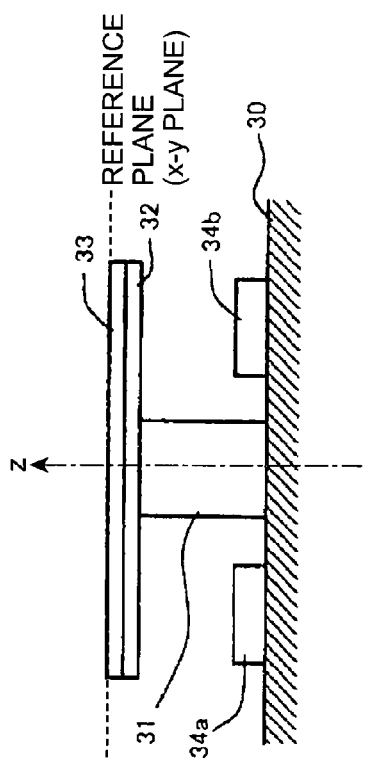
Figure 3D:
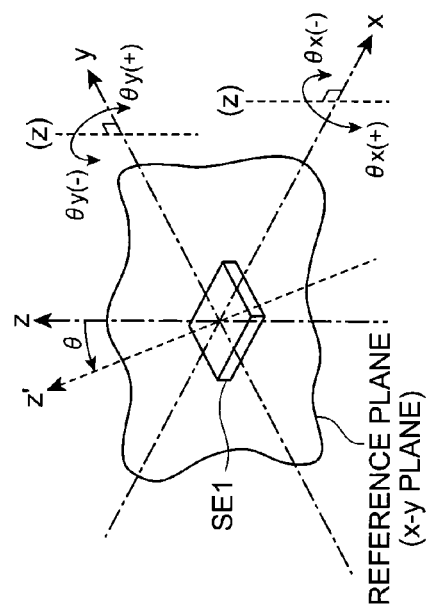

The configuration of the spatial light modulation unit 3 will be described below with reference to FIGS. 2 and 3. FIG. 2 is an optical path diagram showing the spatial light modulation unit 3 and zoom optical system 4 shown in FIG. 1. FIG. 3A is a partial perspective view of the spatial light modulator 3a in the spatial light modulation unit 3, FIG. 3B is a drawing for explaining parameters for control on the postures of the mirror elements, FIG. 3C is a partial perspective view showing one of the mirror elements in the spatial light modulator 3a, and FIG. 3D is a drawing showing a cross section along line I-I of the mirror element shown in FIG. 3C. It is noted that FIGS. 2 and 3 are depicted without hatching for sections, for easier viewing.

As shown in FIG. 2, the spatial light modulation unit 3 has a prism 3b, and the reflective spatial light modulator 3a attached integrally to the prism 3b. The prism 3b is made of a glass material, e.g., fluorite. The prism 3b is of a shape in which one side face of a rectangular parallelepiped is depressed in a V-shaped wedge form, and is also called a K prism. In the prism 3b, one side face of the rectangular parallelepiped part is composed of two planes PS1, PS2 (first and second planes PS1, PS2) intersecting at an obtuse angle as an intersecting line (straight line) P1a between them subsides inside. The spatial light modulator 3a is attached onto a side face of the prism 3b facing both of these two side faces in contact at the intersecting line P1a. The optical material forming the base of the spatial light modulator 3a is not limited to fluorite, but it may be silica glass or other optical glass.

The two side faces (the sides facing each other) in contact at the intersecting line P1a function as first and second reflecting surfaces R11, R12. Therefore, the first reflecting surface R11 is located on the first plane PS1. The second reflecting surface R12 is located on the second plane PS2 intersecting with the first plane PS1. The angle between the first and second reflecting surfaces R11, R12 is an obtuse angle.

The angles herein may be determined, for example, as follows: the angle between the first and second reflecting surfaces R11, R12 is 120°; the angle between the side face (entrance plane IP) of the prism P1 perpendicular to the optical axis AX, and the first reflecting surface R11 is 60°; the angle between the side face (exit plane OP) of the prism P1 perpendicular to the optical axis AX, and the second reflecting surface R12 is 60°.

The prism 3b is so arranged that the side face to which the spatial light modulator 3a is attached is parallel to the optical axis AX, that the first reflecting surface R11 is located on the light source 1 side (upstream in the exposure apparatus EA), and that the second reflecting surface R12 is located on the fly's eye lens 5 side (downstream in the exposure apparatus EA). Therefore, the first reflecting surface R11 of the prism 3b is obliquely arranged with respect to the optical axis AX of the exposure apparatus EA, as shown in FIG. 2. The second reflecting surface R12 of the prism 3b is also obliquely arranged with an opposite inclination to the first reflecting surface R11 with respect to the optical axis AX of the exposure apparatus EA, as shown in FIG. 2.

The first reflecting surface R11 of the prism 3b reflects light incident in parallel with the optical axis AX of the exposure apparatus EA. The spatial light modulator 3a is arranged in the optical path between the first reflecting surface R11 and the second reflecting surface R12 and reflects the light reflected on the first reflecting surface R11. The second reflecting surface R12 of the prism 3b reflects the light reflected on the spatial light modulator 3a. This light from the reflecting surface R12 is emitted, specifically, into the zoom optical system 4 in the illumination apparatus IL of the exposure apparatus EA.

Therefore, the intersecting line P1a being a ridge line formed by the first and second planes PS1, PS2 is located on the spatial light modulator 3a side with respect to the first and second reflecting surfaces R11, R12.

The prism 3b in this embodiment is integrally formed of one optical block, but the prism 3b may be constructed using a plurality of optical blocks.

The spatial light modulator 3a applies spatial modulation to the incident light, according to a position where the light reflected on the first reflecting surface R11 is incident. This spatial light modulator 3a, as described below, includes a large number of microscopic mirror elements SE1 arranged two-dimensionally on a predetermined plane.

For this reason, the light beam incident to the spatial light modulator 3a travels, for example, as follows: a ray L1 impinges upon a mirror element SE1a out of the plurality of mirror elements SE1 of the spatial light modulator 3a; a ray L2 impinges upon a mirror element SE1b different from the mirror element SE1a out of the plurality of mirror elements SE1 of the spatial light modulator 3a; a ray L3 impinges upon a mirror element SE1c different from the mirror elements SE1a, SE1b out of the plurality of mirror elements SE1 of the spatial light modulator 3a; a ray L4 impinges upon a mirror element SE1d different from the mirror elements SE1a-SE1c out of the plurality of mirror elements SE1 of the spatial light modulator 3a; a ray L5 impinges upon a mirror element SE1e different from the mirror elements SE1a-SE1d out of the plurality of mirror elements SE1 of the spatial light modulator 3a. The mirror elements SE1a-SE1e apply the spatial modulation according to the installation position of their own to the arriving rays L1-L5, respectively. FIG. 2 is depicted with illustration of only the five mirror elements SE1a-SE1e, for easier explanation, but the number of mirror elements does not have to be limited to five.

The prism 3b is so arranged that an air-equivalent length from the entrance plane IP of the prism 3b (where the rays L1-L5 are incident) via the mirror elements SE1a-SE1e to the exit plane OP of the prism 3b where the rays are outgoing, is equal to an air-equivalent length from a position corresponding to the entrance plane IP to a position corresponding to the exit plane OP without the prism 3b in the exposure apparatus EA. An air-equivalent length is an optical path length obtained by reducing an optical path length in an optical system to one in air having the refractive index of 1, and an air-equivalent length in a medium having the refractive index n is obtained by multiplying an optical path length therein by 1/n.

The spatial light modulator 3a is arranged near the front focal point of the zoom optical system 4 which can be regarded as a condensing optical system. The light reflected by the mirror elements SE1a-SE1e of the spatial light modulator 3a and provided with a predetermined angle distribution forms a light intensity distribution at a predetermined position on the rear focal plane 5a of the zoom optical system 4. Namely, the zoom optical system 4 is a Fourier transform optical system which converts angles given to the emerging rays by the mirror elements SE1a-SE1e of the spatial light modulator 3a, into positions on the plane 5a being the far field (Fraunhofer diffraction region) of the spatial light modulator 3a. The zoom optical system 4 applicable herein is, for example, a zoom optical system whose projection is an orthogonal projection.

Referring back to FIG. 1, the entrance plane of the fly's eye lens 5 is located near this plane Sa and the light intensity distribution (luminance distribution) of the secondary light source formed by the fly's eye lens 5 is a distribution according to the light intensity distribution formed by the spatial light modulator 3a and zoom optical system 4.

The spatial light modulator 3a, as shown in FIG. 3A, is a movable multi-mirror including the mirror elements SE1 being a large number of microscopic reflecting elements laid with their reflecting surface of a planar shape up. Each mirror element SE1 is movable and inclination of the reflecting surface thereof, i.e., an angle and direction of inclination of the reflecting surface, is independently controlled by the control unit 10 (posture control of the reflecting surfaces). Each mirror element SE1 can be continuously or discretely rotated by a desired angle of rotation around each of axes along two directions parallel to the reflecting surface thereof and orthogonal to each other. Namely, each mirror element SE1 is so configured that the inclination thereof can be controlled in two dimensions along the reflecting surface thereof. In the case of discrete rotation, a preferred control method is to control the angle of rotation in multiple stages (e.g., ..., −2.5°, −2.0°, ..., 0°, +0.5°, ..., +2.5°, ...).

The above-described posture control of the reflecting surface for each mirror element SE1 is implemented by adjusting an angle θ between a normal to a reference plane of the spatial light modulator 3a (z-axis) and a normal to the reflecting surface (z' axis), as shown in FIG. 3B. The reference plane herein is a plane coincident with the reflecting surface before the posture control, which is an x-y plane defined by an x-axis and a y-axis orthogonal to the normal z' to the reflecting surface before the posture control. The angle θ between the normal z (z-axis) to the reference plane and the normal z' to the reflecting surface is given by a rotation angle component $\theta_x$ around the x-axis and a rotation angle component $\theta_y$ around the y-axis, as specific posture control information. Specifically, the rotation angle component $\theta_x$ is an angle between the normal z to the reference plane and the normal z' to the reflecting surface when the normal z' is projected onto the y-z plane, and the rotation angle component $\theta_y$ is an angle between the normal z to the reference plane and the normal z' to the reflecting surface when the normal z' is projected onto the x-z plane.

In addition, the contour of the mirror elements SE1 is square in this embodiment, but the contour is not limited to it. However, the contour is preferably a shape permitting arrangement without a gap (the closest packing) in terms of light utilization efficiency. The gap between adjacent mirror elements SE1 is preferably set to a necessary minimum level.

FIG. 3C is a drawing schematically showing a configuration of one mirror element out of the plurality of mirror elements SE1 of the spatial light modulator 3a and, more specifically, a drawing schematically showing a drive unit for controlling the posture of the reflecting surface in the mirror element SE1. FIG. 3D is a drawing showing a cross section of the mirror element SE1 along line I-I shown in FIG. 3C. In FIGS. 3C and 3D, the mirror element SE1 has a base 30, a support 31 disposed on this base 30, a plate member 32 connected to the support 31 on the opposite side to the base 30, a reflecting surface 33 consisting of a reflecting film formed on this plate member 32, and four electrodes 34a-34d arranged so as to surround the support 31 on the base 30.

The plate member 32 is inclinable around two axes (x-axis and y-axis) orthogonal to each other on a plane parallel to the base 30 with a fulcrum at a joint to the support 31. Then potentials are given to the electrodes 34a-34d arranged at respective positions on the base side corresponding to the four corners of the plate member 32, to generate an electrostatic force between each electrode 34a-34d and the plate member 32, thereby varying the gap between each electrode 34a-34d and the plate member 32 (drive unit). This causes the plate member 32 to be inclined on the fulcrum of the support 31 and, therefore, the reflecting surface 33 formed on the plate member 32 is inclined.

Now, multilevel control of the light intensity distribution (pupil luminance distribution) formed on the illumination pupil plane will be explained referring back to FIG. 2. In the state of the spatial light modulator 3a shown in FIG. 2, the mirror elements are arranged as follows: among the five mirror elements SE1a-SE1e, each of the three mirror elements SE1a, SE1c, SE1e is inclined by a first angle ($\theta_{x1}$, $\theta_{y1}$) with respect to the reference plane of the spatial light modulator 3a; each of the two mirror elements SE1b, SE1d is inclined by a second angle ($\theta_{x2}$, $\theta_{y2}$) different from the first angle with respect to the reference plane of the spatial light modulator 3a.

Accordingly, the reference plane of the spatial light modulator 3a (cf. FIG. 3B) means a plane in which the large number of mirror elements SE1 of the spatial light modulator 3a are two-dimensionally arranged. The first angle and second angle are defined using rotation directions $\theta_x$, $\theta_y$ around the rotation axes of two axes (x-axis and y-axis) orthogonal in the foregoing plane, as shown in FIG. 3B.

The rays L1, L3, L5 reflected on the three mirror elements SE1a, SE1c, SE1e of the spatial light modulator 3a are reflected on the second reflecting surface R12 of the prism 3b and thereafter are condensed by the zoom optical system 4. As a consequence, the rays L1, L3, L5 arrive at a point P1 on the rear focal plane Sa of the zoom optical system 4. On the other hand, the rays L2, L4 reflected on the two mirror elements SE1b, SE1d of the spatial light modulator 3a are reflected on the second reflecting surface R12 of the prism 3b and thereafter are condensed by the zoom optical system 4. As a consequence, the rays L2, L4 arrive at a point P2 on the rear focal plane 5a of the zoom optical system 4.

In this manner, the rays from the three mirror elements SE1a, SE1c, SE1e are focused at the point P1, while the rays from the two mirror elements SE1b, SE1d are focused at the point P2. As a result, a ratio of the light intensity at the point P1 to the light intensity at the point P2 is 3:2. Based on such relationship between the numbers of mirror elements and the light intensity ratio, the light intensity at a predetermined point (P1 or P2) is determined according to the number of reflecting surfaces (SE1a, SE1c, SE1e or SE1b, SE1d) contributing to rays (L1, L3, L5 or L2, L4) arriving at the predetermined point (P1 or P2) on the rear focal plane 5a of the zoom optical system 4 which can be regarded as the illumination pupil plane. Namely, the light intensity distribution on the plane 5a can be controlled to a desired distribution. In the configuration example shown in FIG. 2, the light intensity distribution (pupil luminance distribution) formed on the plane 5a is one in which the light intensity at the point P1 is 3, the light intensity at the point P2 is 2, and the light intensity in the other region is 0.

Therefore, when the control unit 10 (cf. FIG. 1) to perform the posture control in the spatial light modulator 3a is configured to control the number of reflecting surfaces contributing to arriving light, for each point (e.g., P1 or P2) forming the light intensity distribution formed on the plane 5a, the light intensity at the predetermined point (P1 or P2) on the plane 5a can be set at a desired value and, in turn, the light intensity distribution on the plane 5a can be optionally controlled on a multilevel basis.

Since in this embodiment the zoom optical system 4 has the optical Fourier transform action, the rays are superimposed at one point P1 on the rear focal plane 5a of the zoom optical system 4 even though the inclinations of the three mirror elements SE1a, SE1c, SE1e are the same first angle ($\theta_{x1}$, $\theta_{y1}$); and the rays are also superimposed at one point P2 on the rear focal plane 5a of the zoom optical system 4 even though the inclinations of the two mirror elements SE1b, SE1d are the same second angle ($\theta_{x1}$, $\theta_{y2}$). In this embodiment, as described above, the inclinations of the reflecting surfaces contributing to light arriving at a certain point on the plane 5a are controlled not to different inclinations, but to the same inclination (the same posture).

In this embodiment, the angle information of light caused by inclinations of the mirror elements SE1 of the spatial light modulator 3a is converted into position information on the plane 5a being a Fourier transform plane, by the optical Fourier transform action of the zoom optical system 4. Conversely, angle information of light on the Fourier transform plane 5a is converted into position information on the arrangement plane of the mirror elements SE1 of the spatial light modulator 3a. As a result, the divergence angle (NA) of beams reaching the plane 5a which can be regarded as the illumination pupil plane is effectively prevented from varying in the plane 5a. In addition, selection of settings of mirror elements and inclinations thereof can be done without any restrictions on which mirror element SE1 should be set at which inclination out of the plurality of mirror elements SE1, for setting the light intensity distribution (pupil luminance distribution) formed on the plane 5a, to a desired distribution.

Figure 4:
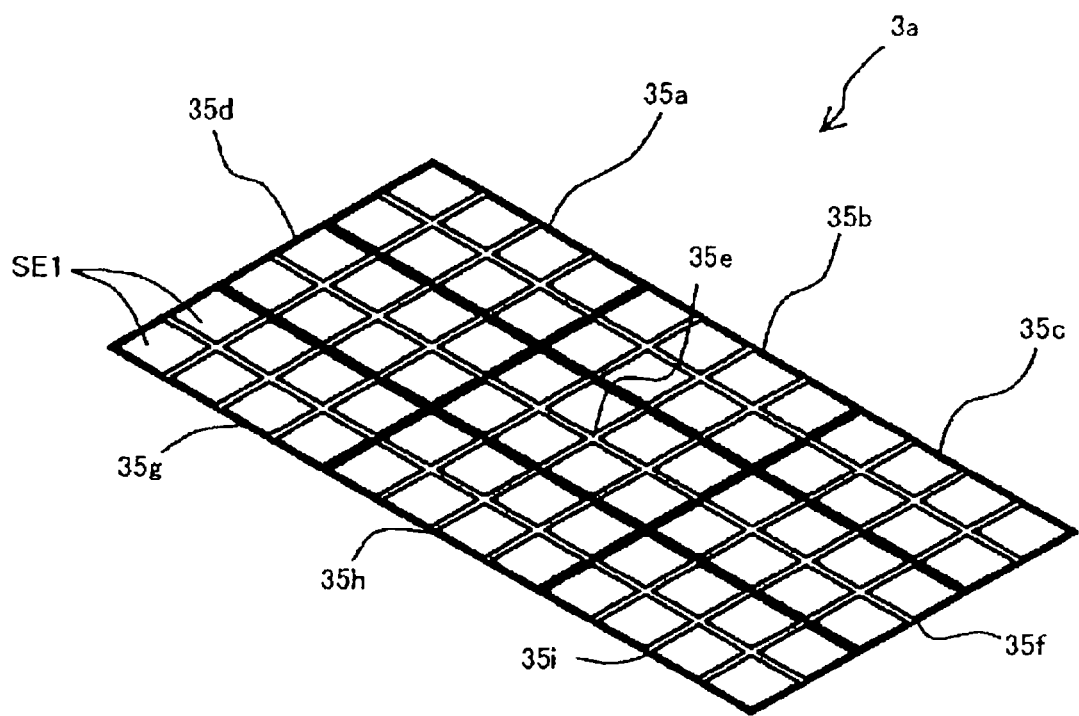
FIG. 4 is a drawing for explaining an example of grouping of a plurality of mirror elements in the spatial light modulator shown in FIG. 2.

For example, it is also possible to adopt a method of grouping the plurality of mirror elements SE1 of the spatial light modulator 3a into a plurality of mirror element groups 35a-35i and letting the mirror element groups 35a-35i form their respective light intensity distributions (pupil luminance distributions) on the plane 5a, as shown in FIG. 4. It is also possible to adopt another method of assigning the plurality of mirror elements SE1 of the spatial light modulator 3a completely at random.

Figure 5A:
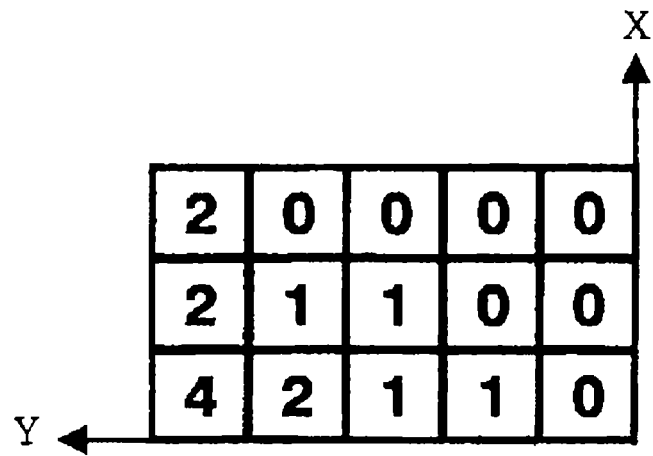
FIGS. 5A and 5B are drawings for schematically explaining another example of a technique to control a pupil intensity distribution on a multilevel basis.
Figure 5B:
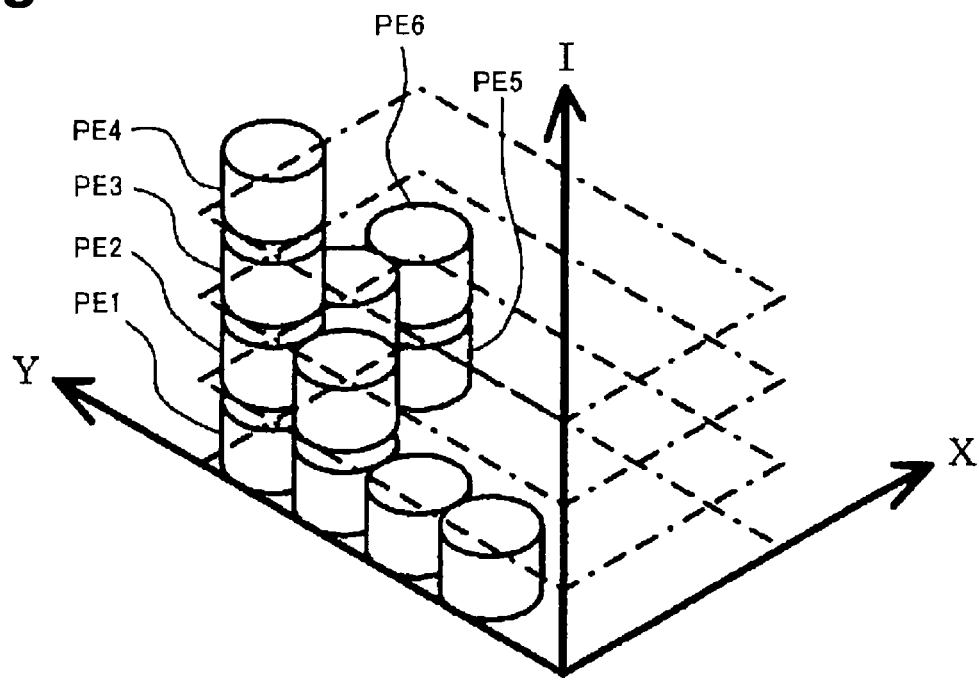

FIGS. 5A and 5B are drawings for schematically explaining anther example of the method for multilevel control of the pupil intensity distribution. Specifically, FIG. 5A is a matrix showing an example of the light intensity distribution (pupil intensity distribution) of 4-valued expression where the illumination pupil plane is composed of 15 pixels in 3 rows×5 columns, and FIG. 5B is a drawing for schematically explaining assignment of light necessary for obtaining the multilevel light intensity distribution shown in FIG. 5A.

For example, for obtaining the light intensity of the leftmost bottom pixel on the matrix shown in FIG. 5A, light energies PE1-PE4 from four mirror elements of the spatial light modulator 3a are superimposed on the leftmost bottom pixel to obtain intensity 4, as shown in FIG. 5B. Similarly, for obtaining the light intensity of the leftmost top pixel on the matrix shown in FIG. 5A, light energies PE5, PE6 from two mirror elements of the spatial light modulator 3a are superimposed on the leftmost top pixel to obtain intensity 2, as shown FIG. 5B.

In this manner, it becomes feasible to control the value of light intensity at a predetermined point on the plane 5a in multiple levels (four levels in the case of FIGS. 5A and 5B), by controlling the number of reflecting surfaces contributing to light arriving at the predetermined point on the plane 5a.

The example shown in FIGS. 5A and 5B showed the division of 15 pixels of 3×5 pixels for the illumination pupil plane in order to simplify the description, but the number of divisions of the illumination pupil plane does not have to be limited to 15, and may be a larger number of divisions, e.g., 40×40 pixels, 128×128 pixels, and so on. Furthermore, the example shown in FIGS. 5A and 5B showed the multilevel expression of the light intensity distribution formed on the illumination pupil plane, based on the multiple values of four levels, but the multilevels do not have to be limited to the four levels, and can be any of various numbers of levels according to need, e.g., three levels, eight levels, and so on.

When the total number of reflecting surfaces necessary for formation of the desired light intensity distribution on the illumination pupil plane is not equal to the total number of mirror elements SE1 of the spatial light modulator 3a illuminated with the light from the light source 1 (which will be referred to hereinafter as an effective number of mirror elements), specifically, when there is a remainder when the effective number of mirror elements is divided by the total number of reflecting surfaces necessary for formation of the pupil intensity distribution on the illumination pupil plane, it is preferable that the light reflected on the remaining reflecting surfaces be directed to the region other than the illumination pupil plane.

When the light reflected on the remaining reflecting surfaces is averagely scattered over the light intensity distribution formed on the illumination pupil plane, intensity unevenness will occur in this light intensity distribution. For example, let the effective number of mirror elements be 169760 and the total number of reflecting surfaces necessary for formation of the light intensity distribution be 12861; then the remainder is 2567. Namely, the number of mirror elements regarded as one reflecting surface is 13 (169760=12861×13+2567) and light reflected from these thirteen mirror elements arrives at one point on the illumination pupil plane.

Let us suppose that the illumination pupil plane is divided in 128×128 pixels and that reflected light from the remaining mirror elements is also guided to any of pixels forming the effective pupil constituting the light intensity distribution. In this case there are pixels at which reflected light from thirteen mirror elements arrives and pixels at which reflected light from fourteen mirror elements arrives, in the effective pupil. In this example, the intensity unevenness of the light intensity distribution formed on the illumination pupil plane is given by $|(14-13)/(14+13)|=|1/27|$, or ±3.7% ($=±(1/27)×100$). On the other hand, since the rate of the remainder to the effective number of mirror elements is 1.5% ($=(2567/169760)×100$), a reduction in illuminance on the entire effective pupil is just 1.5% even in the case where the reflected light from the 2567 remaining mirror elements is guided to the outside region of the effective pupil. Therefore, when the reflected light from the 2567 remaining mirror elements is intentionally guided to the region other than the effective region, the intensity unevenness of the light intensity distribution formed on the illumination pupil plane can be reduced by 3.7%.

In the above embodiment, the spatial light modulator with the plurality of optical elements arranged two-dimensionally and controlled individually had the structure in which each optical element was supported so as to be inclinable on a fulcrum at one support in the center thereof. However, it is also possible to adopt a structure in which each of the optical elements in the spatial light modulator is supported in the peripheral region.

In the above embodiment, the spatial light modulator in which the orientations (inclinations) of the reflecting surfaces arranged two-dimensionally can be individually controlled is used as the spatial light modulator with the plurality of optical elements arranged two-dimensionally and controlled individually. However, without having to be limited to this, it is also possible, for example, to use a spatial light modulator in which heights (positions) of the reflecting surfaces arranged two-dimensionally can be individually controlled. Such a spatial light modulator applicable herein is, for example, one selected from those disclosed in Japanese Patent Application Laid-open No. 6-281869 and U.S. Pat. No. 5,312,513 corresponding thereto, and in FIG. 1d of Japanese Patent Application Laid-open (Translation of PCT Application) No. 2004-520618 and U.S. Pat. No. 6,885,493 corresponding thereto. The teachings of the U.S. Pat. Nos. 5,312,513 and 6,885,493 are incorporated by reference. These spatial light modulators are able to apply the same action as a diffracting surface, to incident light by forming a two-dimensional height distribution therein. In this case, the control unit may be configured to control the number of depressions and projections of the reflecting surfaces in the spatial light modulator (the posture control of the reflecting surfaces in the spatial light modulator by the control unit).

The aforementioned spatial light modulator with the plurality of reflecting surfaces arranged two-dimensionally may be modified, for example, according to the disclosure in Japanese Patent Application Laid-open (Translation of PCT Application) No. 2006-513442 and U.S. Pat. No. 6,891,655 corresponding thereto, or according to the disclosure in Japanese Patent Application Laid-open (Translation of PCT Application) No. 2005-524112 and U.S. Patent Published Application No. 2005/0095749 corresponding thereto. The teachings of the U.S. Pat. No. 6,891,655 and the U.S. Patent Published Application No. 2005/0095749 are incorporated by reference.

In the above-described embodiment and modification examples, the apparatus may be modified so that in the formation of the light intensity distribution (pupil luminance distribution) on the illumination pupil plane using the spatial light modulator 3, the light intensity distribution formed is measured with a light intensity distribution measuring device (pupil luminance distribution measuring device) and the spatial light modulator 3 is controlled according to the result of the measurement. Such technology is disclosed, for example, in Japanese Patent Application Laid-open No. 2006-54328 and in Japanese Patent Application Laid-open No. 2003-22967 and U.S. Patent Published Application No. 2003/0038225 corresponding thereto. The teachings of the U.S. Patent Published Application No. 2003/0038225 are incorporated by reference.

In the aforementioned embodiment, the mask can be replaced with a variable pattern forming device which forms a predetermined pattern on the basis of predetermined electronic data. The variable pattern forming device applicable herein is, for example, a spatial light modulator including a plurality of reflecting elements driven based on predetermined electronic data. The exposure apparatus with such a spatial light modulator is disclosed, for example, in Japanese Patent Application Laid-open No. 2004-304135 and International Publication WO 2006/080285 and U.S. Patent Published Application No. 2007/0296936 corresponding thereto. The teachings of the U.S. Pat. Published Application No. 2007/0296936 are incorporated by reference. Besides the reflective spatial light modulators of the non-emission type, it is also possible to use a transmissive spatial light modulator or a self-emission type image display device.

In the foregoing embodiment, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. 6-124873; the technique of forming a liquid bath of a predetermined depth on a stage and holding the substrate therein as disclosed in Japanese Patent Application Laid-open No. 10-303114, and so on. The teachings of the International Publication WO99/49504, and the Japanese Patent Application Laid-open Nos. 6-124873 and 10-303114 are incorporated by reference.

The exposure apparatus of the foregoing embodiment is manufactured by assembling various sub-systems containing their respective components as set forth in the scope of claims in the present application, so as to maintain predetermined mechanical accuracy, electrical accuracy, and optical accuracy. For ensuring these various accuracies, the following adjustments are carried out before and after the assembling: adjustment for achieving the optical accuracy for various optical systems; adjustment for achieving the mechanical accuracy for various mechanical systems; adjustment for achieving the electrical accuracy for various electrical systems. The assembling blocks from the various sub-systems into the exposure apparatus include mechanical connections, wire connections of electric circuits, pipe connections of pneumatic circuits, etc. between the various sub-systems. It is needless to mention that there are assembling blocks of the individual sub-systems, before the assembling blocks from the various sub-systems into the exposure apparatus. After completion of the assembling blocks from the various sub-systems into the exposure apparatus, overall adjustment is carried out to ensure various accuracies as the entire exposure apparatus. The manufacture of exposure apparatus is desirably performed in a clean room in which the temperature, cleanliness, etc. are controlled.

Figure 6:
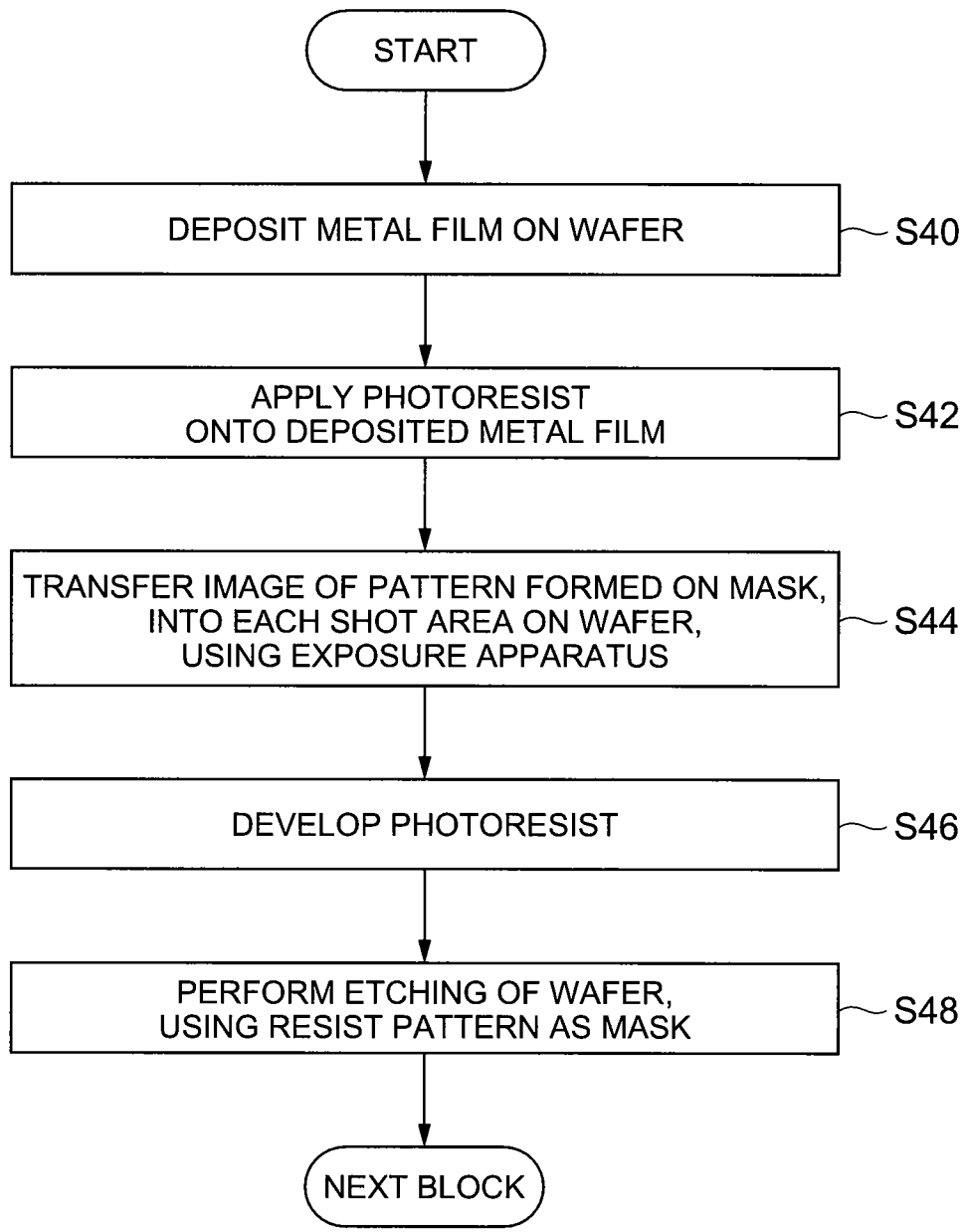
FIG. 6 is a flowchart for explaining manufacturing blocks of semiconductor devices, as the device manufacturing method according to an embodiment of the present invention.

The following will describe a device manufacturing method using the exposure apparatus according to the above-described embodiment. FIG. 6 is a flowchart for explaining manufacturing blocks of semiconductor devices, as the device manufacturing method according to an embodiment of the present invention. As shown in FIG. 6, the manufacturing blocks of semiconductor devices include depositing a metal film on a wafer W to become a substrate of semiconductor devices (block S40) and applying a photoresist as a photosensitive material onto the deposited metal film (block S42). The subsequent blocks include transferring a pattern formed on a mask (reticle) M, into each shot area on the wafer W, using the exposure apparatus (projection exposure apparatus) of the foregoing embodiment (block S44: exposure block), and developing the wafer W after completion of the transfer, i.e., developing the photoresist to which the pattern has been transferred (block S46: development block). Thereafter, using the resist pattern made on the surface of the wafer W in block S46, as a mask, processing such as etching is carried out on the surface of the wafer W (block S48: processing block).

The resist pattern herein is a photoresist layer in which depressions and projections are formed in a shape corresponding to the pattern transferred by the projection exposure apparatus of the foregoing embodiment and which the depressions penetrate throughout. Step S48 is to process the surface of the wafer W through this resist pattern. The processing carried out in block S48 includes, for example, at least either etching of the surface of the wafer W or deposition of a metal film or the like. In block S44, the projection exposure apparatus of the foregoing embodiment performs the transfer of the pattern onto the wafer W coated with the photoresist, as a photosensitive substrate or plate P.

Figure 7:
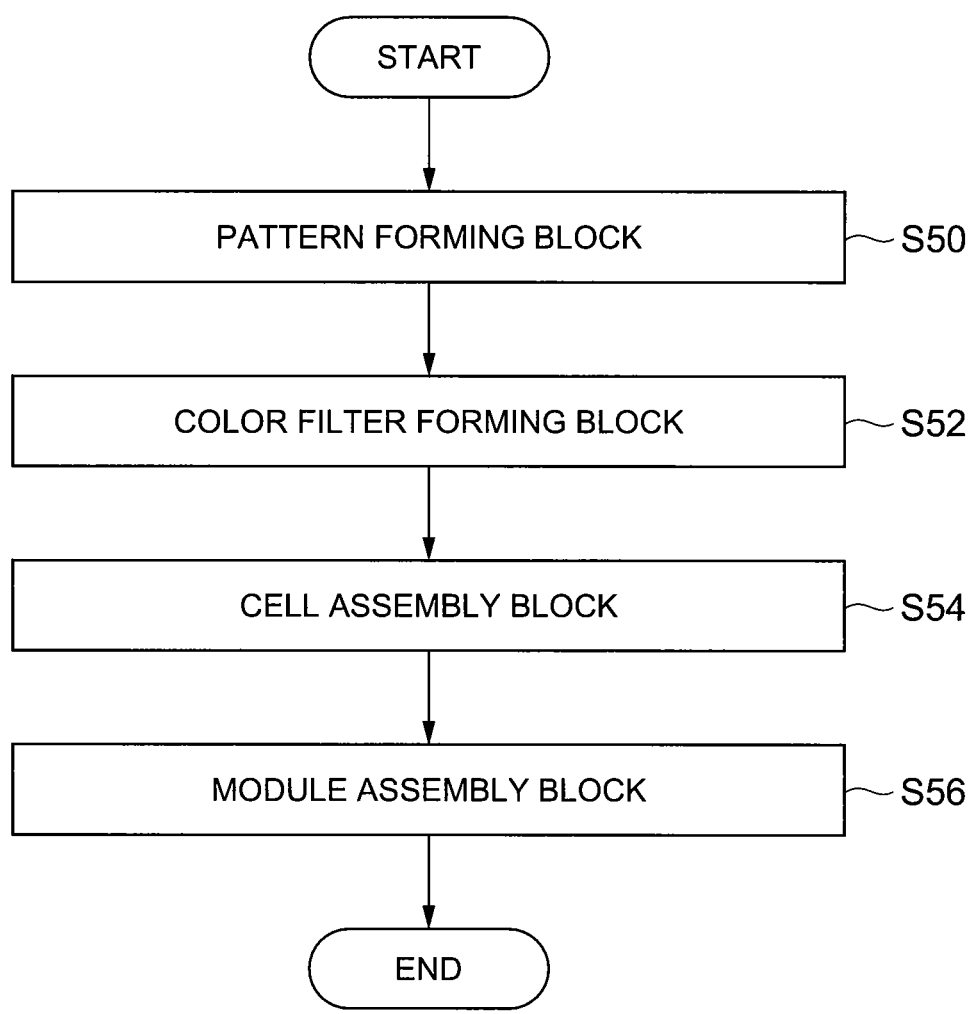
FIG. 7 is a flowchart for explaining manufacturing blocks of a liquid crystal device such as a liquid crystal display device, as the device manufacturing method according to another embodiment of the present invention.

FIG. 7 is a flowchart for explaining manufacturing blocks of a liquid crystal device such as a liquid-crystal display device, as the device manufacturing method according to another embodiment of the present invention. As shown in FIG. 7, the manufacturing blocks of the liquid crystal device include sequentially performing a pattern forming block (block S50), a color filter forming block (block S52), a cell assembly block (block S54), and a module assembly block (block S56).

The pattern forming block of block S50 is to form predetermined patterns such as a circuit pattern and an electrode pattern on a glass substrate coated with a photoresist, as a plate P, using the projection exposure apparatus of the foregoing embodiment. This pattern forming block includes an exposure block of transferring a pattern to a photoresist layer, using the aforementioned projection exposure apparatus, a development block of performing development of the plate P onto which the pattern has been transferred, i.e., development of the photoresist layer on the glass substrate, and then making the photoresist layer in the shape corresponding to the pattern, and a processing block of processing the surface of the glass substrate through the developed photoresist layer.

The color filter forming block of block S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction.

The cell assembly block of block S54 is to assemble a liquid crystal panel (liquid crystal cell), using the glass substrate on which the predetermined pattern has been formed in block S50, and the color filter formed in block S52. Specifically, for example, a liquid crystal is poured into between the glass substrate and the color filter to form the liquid crystal panel. The module assembly block of block S56 is to attach various components such as electric circuits and backlights for display operation of this liquid crystal panel, to the liquid crystal panel assembled in block S54.

An embodiment of the present invention is not limited only to the application to the exposure apparatus for manufacture of semiconductor devices, but can also be widely applied, for example, to the exposure apparatus for the liquid-crystal display devices formed with rectangular glass plates, or for display devices such as plasma displays, and to the exposure apparatus for manufacture of various devices such as imaging devices (CCDs and others), micromachines, thin-film magnetic heads, and DNA chips. Furthermore, an embodiment of the present invention is also applicable to the exposure block (exposure apparatus) for manufacture of masks (photomasks, reticles, etc.) with mask patterns of various devices thereon, by the photolithography process.

In the above-described embodiment, the light (exposure light) supplied by the light source 1 can be an ArF excimer laser light (wavelength: 193 nm) or a KrF excimer laser light (wavelength: 248 nm). However, without having to be limited to this, it is also possible to use any other appropriate laser light source, e.g., an $F_2$ laser light source which supplies laser light at the wavelength of 157 nm.

The aforementioned embodiment was the application of the present invention to the illumination optical system illuminating the mask in the exposure apparatus, but, without having to be limited to this, an embodiment of the present invention can also be applied to a generally-used illumination optical system which illuminates an illumination target surface except for the mask.

As described above, an embodiment of the present invention successfully provides the multilevel pupil luminance distribution (pupil intensity distribution) in which luminances in respective zones are optionally controlled.

As described above, the present invention can be modified in various ways without departing from the scope and spirit of the present invention, without having to be limited to the above embodiments.

What is claimed is:

1. An illumination apparatus which forms a predetermined pupil intensity distribution on an illumination pupil plane by light from a light source and illuminates an illumination target surface with light from the predetermined pupil intensity distribution, the illumination apparatus comprising:
    a spatial light modulator having a plurality of reflecting surfaces arranged two-dimensionally, postures of the respective reflecting surfaces being controlled independently of each other;
    a condensing optical system, arranged between the light source and a position where the predetermined pupil intensity distribution is formed, configured to convert light provided with a predetermined angle distribution by the plurality of reflecting surfaces of the spatial light modulator into a position distribution on a predetermined surface, to form a predetermined light intensity distribution on the predetermined surface;
    a fly's eye optical system having a plurality of optical surfaces arranged two-dimensionally on the predetermined surface, configured to form the predetermined pupil intensity distribution on the illumination pupil plane by light from the condensing optical system; and
    a controller configured to feed a control signal to the spatial light modulator according to the predetermined pupil intensity distribution formed on the illumination pupil plane; wherein
    the predetermined light intensity distribution includes at least a first zone with a first light intensity, a second zone with a second light intensity different from the first light intensity, and a third zone with a third light intensity different from the first and second light intensities, and
    the controller is configured to control the postures of the plurality of reflecting surfaces so that, among the plurality of reflecting surfaces, a number of reflecting surfaces of a first group, a number of reflecting surfaces of a second group, and a number of reflecting surfaces of a third group are different from each other, so that light from the reflecting surfaces of the first group reaches the first zone via the condensing optical system, so that light from the reflecting surfaces of the second group reaches the second zone via the condensing optical system, and so that light from the reflecting surfaces of the third group reaches the third zone via the condensing optical system.

2. The illumination apparatus according to claim 1, wherein,
in the case that there is a remainder when a number of the reflecting surfaces in the spatial light modulator is divided by a total number of reflecting surfaces necessary for formation of the pupil intensity distribution on the illumination pupil plane, the controller controls the postures of the respective reflecting surfaces so that light reflected by remaining reflecting surfaces is guided to a region other than the illumination pupil plane.

3. The illumination apparatus according to claim 2, further comprising
an intensity distribution measuring device for performing measurement of the pupil intensity distribution formed on the illumination pupil plane,
wherein the controller controls the postures of the reflecting surfaces in the spatial light modulator, based on a result of the measurement from the intensity distribution measuring device.

4. The illumination apparatus according to claim 1, further comprising
an intensity distribution measuring device for performing measurement of the pupil intensity distribution formed on the illumination pupil plane,
wherein the controller controls the postures of the plurality of reflecting surfaces in the spatial light modulator, based on a result of the measurement from the light-intensity distribution measuring device.

5. The illumination apparatus according to claim 1, wherein
the spatial light modulator comprises a drive unit for individually changing the postures of the plurality of reflecting surfaces on the basis of a control signal from the controller.

6. The illumination apparatus according to claim 5, wherein
the drive unit continuously or discretely changes orientations of the plurality of reflecting surfaces.

7. The illumination apparatus according to claim 6, wherein
the reflecting surfaces contributing to light arriving at a predetermined point on the illumination pupil plane are subjected to such posture control that normals to the respective reflecting surfaces become parallel to each other.

8. An exposure apparatus comprising an illumination apparatus as set forth in claim 1 which illuminates a predetermined pattern, the exposure apparatus exposing the predetermined pattern on a photosensitive substrate.

9. A device manufacturing method comprising:
effecting the exposure of the predetermined pattern on the photosensitive substrate, using the exposure apparatus of claim 8;
developing the photosensitive substrate onto which the predetermined pattern has been transferred, and then forming a mask layer in a shape corresponding to the predetermined pattern on a surface of the photosensitive substrate; and
processing the surface of the photosensitive substrate through the mask layer.

10. The illumination apparatus according to claim 1, further comprising:
an optical integrator arranged at a rear side of the condensing optical system in a traveling direction of the illumination light.

11. An illumination method of forming a predetermined pupil intensity distribution on an illumination pupil plane by light from a light source and illuminating an illumination target surface with light from the predetermined pupil intensity distribution, the illumination method comprising:
reflecting light from the light source by a plurality of reflecting surfaces, postures of which are controlled independently of each other and which are two-dimensionally arranged;
converting light, a predetermined angle distribution of which is provided by the plurality of reflecting surfaces reflecting the light, into a position distribution on a predetermined surface, while guiding the light to a plurality of optical surfaces arranged two-dimensionally on the predetermined surface;
forming a predetermined light intensity distribution on the predetermined surface, the predetermined light intensity distribution including at least a first zone with a first light intensity, a second zone with a second light intensity different from the first light intensity, and a third zone with a third light intensity different from the first and second light intensities, the first to third zones being zones on the illumination pupil plane;
forming the predetermined pupil intensity distribution on the illumination pupil plane by light via the plurality of optical surfaces; and
controlling the postures of the plurality of the reflecting surfaces so that, among the plurality of reflecting surfaces, a number of reflecting surfaces of a first group, a number of reflecting surfaces of a second group, and a number of reflecting surfaces of a third group are different from each other, so that light from the reflecting surfaces of the first group reaches the first zone, so that light from the reflecting surfaces of the second group reaches the second zone, and so that light from the reflecting surfaces of the third group reaches the third zone.

12. The illumination method according to claim 11, wherein,
in the case that there is a remainder when a number of the reflecting surfaces is divided by a total number of reflecting surfaces necessary for formation of the pupil intensity distribution on the illumination pupil plane, the postures of the respective reflecting surfaces are controlled so that light reflected by remaining reflecting surfaces is guided to a region other than the illumination pupil plane.

13. The illumination method according to claim 11, wherein
the postures of the reflecting surfaces are controlled based on a result of measurement of the pupil intensity distribution formed on the illumination pupil plane.

14. The illumination method according to claim 11, wherein
orientations of the reflecting surfaces are continuously or discretely changed.

15. The illumination method according to claim 11, wherein
the reflecting surfaces contributing to light arriving at a predetermined point on the illumination pupil plane are subjected to such posture control that normals to the respective reflecting surfaces are parallel to each other.

16. The illumination method according to claim 11, further comprising:
passing the light through an optical integrator after the light has passed through the condensing optical system.

17. An illumination apparatus which illuminates an illumination target surface with light from a light source, the illumination apparatus comprising:

a spatial light modulator having a plurality of reflecting surfaces arranged two-dimensionally, postures of the respective reflecting surfaces being controlled independently of each other;

a first condensing optical system, arranged between the spatial light modulator and the illumination target surface, configured to condense light from the plurality of reflecting surfaces of the spatial light modulator onto a predetermined surface in an optical path of the illumination apparatus;

a fly's eye optical system having a plurality of optical surfaces arranged two-dimensionally on the predetermined surface, configured to form a light intensity distribution on an illumination pupil plane by light from the first condensing optical system; and a controller configured to control the plurality of reflecting surfaces of the spatial light modulator, wherein the controller controls reflecting surfaces, belonging to a first group, among the plurality of reflecting surfaces so that light from the reflecting surfaces of the first group reaches a first zone on the predetermined surface, controls reflecting surfaces, belonging to a second group different from the first group, among the plurality of reflecting surfaces so that light from the reflecting surfaces of the second group reaches a second zone different from the first zone on the predetermined surface, and controls reflecting surfaces, belonging to a third group different from the first and second groups, among the plurality of reflecting surfaces so that light from the reflecting surfaces of the third group reaches a third zone different from the first and second zones on the predetermined surface, a number of the reflecting surfaces of the first group, a number of the reflecting surfaces of the second group, and a number of the reflecting surfaces of the third group are different from each other, and a light intensity of the first zone, a light intensity of the second zone, and a light intensity of the third zone are different from each other.

18. The illumination apparatus according to claim 17, further comprising:

a second condensing optical system arranged between the illumination pupil plane and the illumination target surface, the second condensing optical system being configured to condense light from the illumination pupil plane onto the illumination target surface.

19. The illumination apparatus according to claim 18, wherein the second condensing optical system causes a condition that the illumination target surface becomes an optical Fourier transform surface of the illumination pupil plane.

20. The illumination apparatus according to claim 18, wherein the illumination apparatus is used together with a projection optical system which projects a pattern arranged on the illumination target surface onto an image surface.

21. The illumination apparatus according to claim 17, wherein the spatial light modulator is arranged near a front focal point of the first condensing optical system.

22. The illumination apparatus according to claim 21, wherein a rear focal point of the first condensing optical system is located on the predetermined surface.

23. The illumination apparatus according to claim 17, wherein a region in which the reflecting surfaces of the first group are located, a region in which the reflecting surfaces of the second group are located, and a region in which the reflecting surfaces of the third group are located do not overlap each other on the spatial light modulator.

24. The illumination apparatus according to claim 17, wherein in the case that there is a remainder when a number of the plurality of reflecting surfaces of the spatial light modulator is divided by a total number of reflecting surfaces necessary for formation of the light intensity distribution on the illumination pupil plane, the controller respectively controls postures of the plurality of reflecting surfaces so that light reflected by remaining reflecting surfaces is guided to a region other than the illumination pupil plane.

25. An illumination method which illuminates an illumination target surface with light from a light source, the illumination method comprising:

reflecting the light from the light source by a plurality of reflecting surfaces arranged two-dimensionally, respective postures of the plurality of reflecting surfaces being controlled independently of each other;

guiding light reflected by the plurality of reflecting surfaces onto a plurality of optical surfaces arranged two-dimensionally on a predetermined surface; and forming a light intensity distribution on an illumination pupil plane by light going through the plurality of optical surfaces, wherein the reflecting includes: controlling postures of reflecting surfaces, belonging to a first group, among the plurality of reflecting surfaces so that light from the reflecting surfaces of the first group reaches a first zone on the predetermined surface, controlling postures of reflecting surfaces, belonging to a second group different from the first group, among the plurality of reflecting surfaces so that light from the reflecting surfaces of the second group reaches a second zone different from the first zone on the predetermined surface; and controlling postures of reflecting surfaces, belonging to a third group different from the first and second groups, among the plurality of reflecting surfaces so that light from the reflecting surfaces of the third group reaches a third zone different from the first and second zones on the predetermined surface, a number of the reflecting surfaces of the first group, a number of the reflecting surfaces of the second group, and a number of the reflecting surfaces of the third group are different from each other, and a light intensity of the first zone, a light intensity of the second zone, and a light intensity of the third zone are different from each other.

26. The illumination method according to claim 25, further comprising:

condensing light from the illumination pupil plane onto the illumination target surface.

27. The illumination method according to claim 26, wherein the condensing includes causing a condition that the illumination target surface becomes an optical Fourier transform surface of the illumination pupil plane.

28. The illumination method according to claim 26, wherein
the illumination method is used for projecting a pattern arranged on the illumination target surface onto an image surface by using a projection optical system, and
a surface having an aperture stop of the projection optical system and the illumination pupil plane are conjugate with each other.

29. The illumination method according to claim 25, wherein
the guiding is performed by a condensing optical system, and
a surface on which the plurality of reflecting surfaces are two-dimensionally arranged is located near a front focal point of the condensing optical system.

30. The illumination method according to claim 29, wherein
a rear focal point of the condensing optical system is located on the predetermined surface.

31. The illumination method according to claim 25, wherein
a region in which the reflecting surfaces of the first group are located, a region in which the reflecting surfaces of the second group are located, and a region in which the reflecting surfaces of the third group are located do not overlap each other on a surface on which the plurality of reflecting surfaces are two-dimensionally arranged.

32. The illumination method according to claim 25, wherein
in the case that there is a remainder when a number of the plurality of reflecting surfaces is divided by a total number of reflecting surfaces necessary for formation of the pupil intensity distribution on the illumination pupil plane, the reflecting includes respectively controlling postures of the plurality of reflecting surfaces so that light reflected by remaining reflecting surfaces is guided to a region other than the illumination pupil plane.

* * * * *